US012604484B2

(12) United States Patent
Jung

(10) Patent No.: US 12,604,484 B2
(45) Date of Patent: Apr. 14, 2026

(54) SEMICONDUCTOR DEVICE INCLUDING DATA STORAGE STRUCTURE AND METHOD OF MANUFACTURING DATA STORAGE STRUCTURE

(71) Applicant: Samsung Electronics Co., Ltd., Suwon-si (KR)

(72) Inventor: Kyooho Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 437 days.

(21) Appl. No.: 18/185,586

(22) Filed: Mar. 17, 2023

(65) Prior Publication Data

US 2024/0064999 A1     Feb. 22, 2024

(30) Foreign Application Priority Data

Aug. 22, 2022     (KR) ........................ 10-2022-0104720

(51) Int. Cl.
H10B 63/10          (2023.01)
H10B 63/00          (2023.01)

(52) U.S. Cl.
CPC ............. H10B 63/10 (2023.02); H10B 63/84 (2023.02)

(58) Field of Classification Search
CPC . H01L 21/02356; H10B 12/033; H10B 12/31; H10B 12/315; H10B 63/10; H10B 63/84; H10D 1/68; H10D 1/682; H10N 70/011; H10N 70/231; H10N 70/881; H10N 70/883; H10N 70/8833; H10N 70/8836
See application file for complete search history.

(56) References Cited

U.S. PATENT DOCUMENTS

| | | | | |
|---|---|---|---|---|
| 6,785,120 B1 * | 8/2004 | Basceri | .................. | H10D 1/694 |
| | | | | 257/E21.018 |
| 7,709,359 B2 | 5/2010 | Boescke et al. | | |
| 8,435,854 B1 * | 5/2013 | Malhotra | .......... | H01L 21/02356 |
| | | | | 257/E21.396 |
| 9,159,551 B2 | 10/2015 | Antonov et al. | | |
| 10,790,149 B2 | 9/2020 | Clark et al. | | |
| 2004/0043541 A1 * | 3/2004 | Ahn | .................. | H01L 21/28185 |
| | | | | 257/E21.247 |
| 2008/0203529 A1 * | 8/2008 | Kang | ....................... | H10D 1/68 |
| | | | | 257/532 |
| 2013/0071987 A1 * | 3/2013 | Chen | ................. | H01L 21/02178 |
| | | | | 438/396 |
| 2013/0107604 A1 * | 5/2013 | Wang | ................... | H10N 70/231 |
| | | | | 257/E21.645 |
| 2017/0004967 A1 * | 1/2017 | Kil | .................... | H01L 21/02362 |
| 2018/0315811 A1 * | 11/2018 | Cho | ....................... | H10D 1/042 |
| 2020/0058731 A1 | 2/2020 | Mun et al. | | |

(Continued)

*Primary Examiner* — Andres Munoz
(74) *Attorney, Agent, or Firm* — Fish & Richardson P.C.

(57)          ABSTRACT

A data storage structure may include a lower electrode, a dielectric layer on the lower electrode, and an upper electrode on the dielectric layer. The dielectric layer may include a metal compound having a crystalline phase and including a first metal. The dielectric layer also may include a phase control material located in an interfacial region of the dielectric layer, adjacent to the upper electrode. The phase control material may include at least one of a second metal and a metal nitride. The second metal may be configured to induce a phase change in the metal compound of the dielectric layer. The metal nitride may include the second metal.

7 Claims, 25 Drawing Sheets

(56)  References Cited

U.S. PATENT DOCUMENTS

| | | | |
|---|---|---|---|
| 2020/0091278 A1* | 3/2020 | Jung | ................. H01L 21/02356 |
| 2020/0335333 A1 | 10/2020 | Kang et al. | |
| 2021/0140049 A1 | 5/2021 | Han et al. | |

* cited by examiner

Equivalent Oxide Thickness( Å )

100

A

A

200

282

260
250
230
240P2
240P1 } 240

220
212
210

Z
Y
X

200

SEMICONDUCTOR DEVICE INCLUDING DATA STORAGE STRUCTURE AND METHOD OF MANUFACTURING DATA STORAGE STRUCTURE

CROSS-REFERENCE TO RELATED APPLICATION(S)

This application claims the benefit under 35 USC 119(a) of Korean Patent Application No. 10-2022-0104720, filed on Aug. 22, 2022 in the Korean Intellectual Property Office, the entire disclosure of which is incorporated herein by reference for all purposes.

BACKGROUND

The present disclosure relates to a semiconductor device including a data storage structure and a method of manufacturing the same.

In accordance with the demand for high integration and miniaturization of semiconductor devices, the sizes of components constituting the semiconductor devices are also being miniaturized. Accordingly, various research has been undertaken to optimize a data storage structure capable of storing information of a semiconductor device.

SUMMARY

Example embodiments provide a semiconductor device including a data storage structure with improved electrical characteristics and reliability, and a method of manufacturing the same.

According to example embodiments, a data storage structure may include a lower electrode, a dielectric layer on the lower electrode, and an upper electrode on the dielectric layer. The dielectric layer may include a metal compound having a crystalline phase and including a first metal. The dielectric layer also may include a phase control material located in an interfacial region of the dielectric layer, the interfacial region being adjacent to the upper electrode. The phase control material may include at least one of a second metal and a metal nitride. The second metal may be configured to induce a phase change in the metal compound of the dielectric layer. The metal nitride may include the second metal.

According to example embodiments, a semiconductor device may include an active region; a word line intersecting the active region; a bit line on the active region, the bit line intersecting the word line, and the bit line being electrically connected to a first region of the active region; a conductive pattern on a side surface of the bit line and the conductive pattern being electrically connected to a second region of the active region; and a data storage structure on the conductive pattern. The data storage structure may include a lower electrode on the conductive pattern, a support layer in contact with a portion of a side surface of the lower electrode, a dielectric layer on the lower electrode and the support layer, and an upper electrode on the dielectric layer. The dielectric layer may include a metal compound of a crystalline phase and a phase control material configured to induce a phase change in the metal compound. The phase control material may be on a surface of the dielectric layer. The phase control material may include at least one of molybdenum, molybdenum nitride, titanium, titanium nitride, tantalum, tantalum nitride, cobalt, cobalt nitride, vanadium, vanadium nitride, ruthenium, ruthenium nitride, and copper.

According to example embodiments, a method of manufacturing a data storage structure may include forming a lower electrode; forming a dielectric layer including a first metal on the lower electrode; forming a phase control layer on the dielectric layer; changing a phase of a material of the dielectric layer by performing a heat treatment process; removing the phase control layer; and forming an upper electrode on the dielectric layer having a changed phase. The phase control layer may include at least one of a second metal and a metal nitride. The second metal may be configured to induce a phase change in a material of the dielectric layer. The metal nitride may include the second metal.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, example embodiments will be described with reference to the accompanying drawings.

Figure 1:
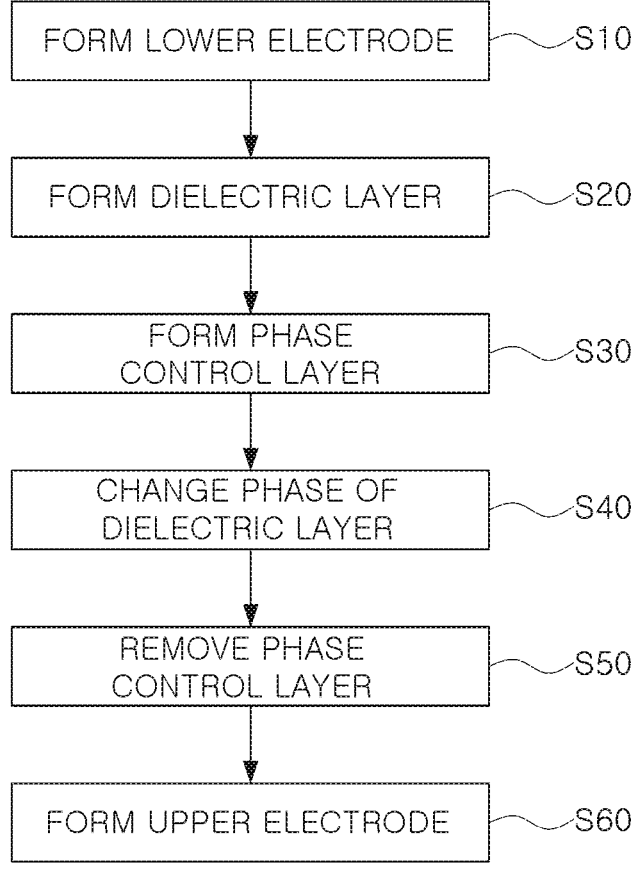
FIG. 1 is a flowchart illustrating a method of manufacturing a data storage structure according to example embodiments.

FIG. 1 is a flowchart illustrating a method of manufacturing a data storage structure according to example embodiments.

FIGS. 2 to 6 are diagrams illustrating a method of manufacturing a data storage structure according to example embodiments.

Figure 2:
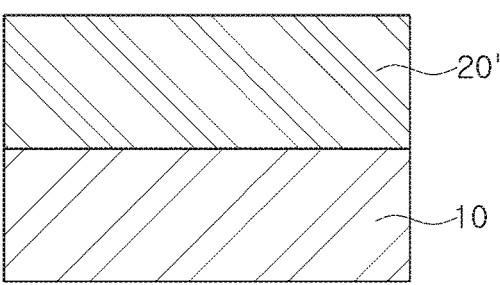
FIGS. 2 to 6 are diagrams illustrating a method of manufacturing a data storage structure according to example embodiments.

Referring to FIGS. 1 and 2, a lower electrode 10 may be formed (S10), and a dielectric layer 20' may be formed on the lower electrode 10 (S20).

The lower electrode 10 may include, for example, doped semiconductor materials, conductive metal nitrides (e.g., titanium nitride, tantalum nitride, niobium nitride, tungsten nitride, or the like), metals (e.g., ruthenium, niobium, iridium, titanium, tantalum, molybdenum, tin, indium, nickel, cobalt, tungsten, zirconium, hafnium, platinum, or the like), conductive metal oxides (e.g., iridium oxide niobium oxide, or the like), or combinations thereof.

The dielectric layer 20' may include, for example, silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof. The dielectric layer 20' may be formed of a single layer or a plurality of layers. The dielectric layer 20' may be deposited on the lower electrode 10 as an amorphous or monoclinic crystalline phase.

In an example, when the dielectric layer 20' is formed of at least one of hafnium oxide, zirconium oxide, and aluminum oxide, the dielectric layer 20' may be deposited as a monoclinic crystal. In an example, when dielectric layer 20' is formed of titanium oxide, dielectric layer 20' may be deposited as anatase.

Figure 3:
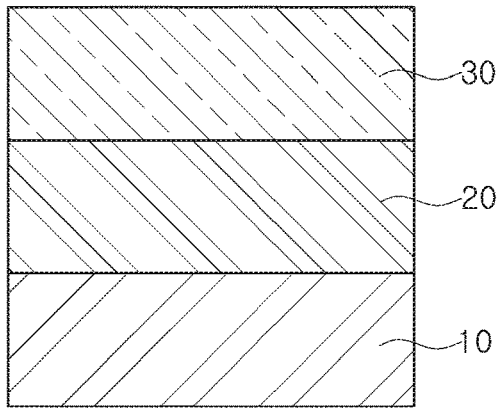

Referring to FIGS. 1 and 3, the phase control layer 30 may be formed on the dielectric layer 20' (S30).

The phase control layer 30 may include a material that induces a phase change in a material constituting the dielectric layer 20'. The phase control layer 30 may include, for example, semiconductor materials, conductive metal nitrides (e.g., titanium nitride, tantalum nitride, molybdenum nitride, cobalt nitride, niobium nitride, tungsten nitride, or the like), metals (e.g., molybdenum, cobalt or the like, zirconium, niobium, titanium, copper, tantalum, vanadium, aluminum, scandium, chromium, manganese, nickel, rubidium, strontium, ruthenium, indium, tin, tungsten, iridium, or lanthanum) or combinations thereof.

Figure 4:
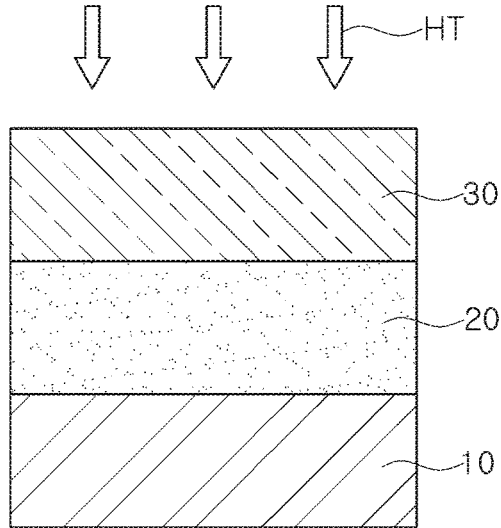

Referring to FIGS. 1 and 4, a phase of a material constituting the dielectric layer 20' may be changed by performing a heat treatment process (HT) (S40).

The phase control layer 30 may induce a phase change in the dielectric layer 20' during the heat treatment process HT. For example, the phase change may be a change from an amorphous to a crystalline phase. For example, the phase change may be a change from a monoclinic crystal to a tetragonal crystal phase or a change from a monoclinic crystal to an orthorhombic crystal phase. For example, the dielectric layer 20' may be phase changed from anatase phase to rutile phase.

The dielectric layer 20' may be formed as the dielectric layer 20 in which at least one region has a phase change after performing a heat treatment process. For example, a material constituting the dielectric layer 20 may have a crystalline phase. For example, the material constituting the dielectric layer 20 may include a first region that is crystallized to have a crystalline phase and a second region that is not crystallized and is formed of an amorphous phase, and the first region may be located closer to the surface of the dielectric layer 20 than the second region.

The phase-changed dielectric layer 20 may have a higher dielectric constant than that of the dielectric layer 20' before performing the heat treatment process. Since the phase-changed dielectric layer 20 has a high dielectric constant, the effective oxide film thickness may be reduced, and the capacitance of the data storage structure may increase.

Figure 5:
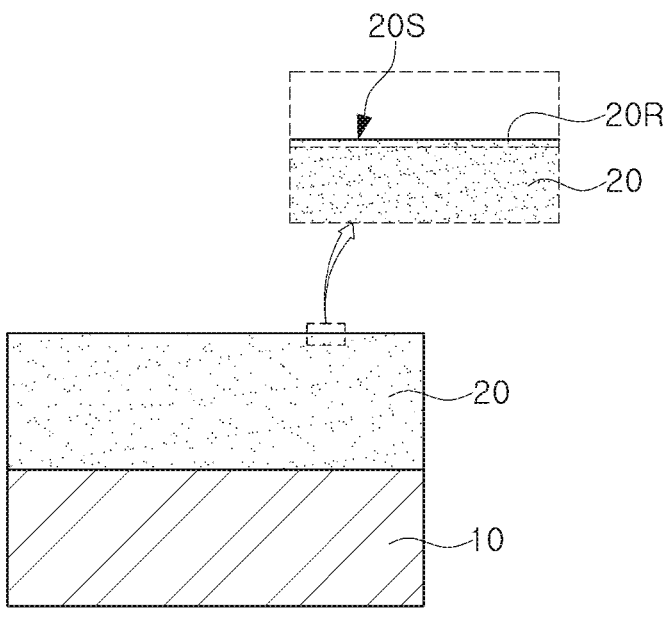

Referring to FIGS. 1 and 5, the phase control layer 30 may be removed (S50).

The phase control layer 30 may be removed through an etching process. The etching process may be, for example, a wet etching process, but is not limited thereto. In the etching process, the phase control layer 30 may be selectively removed with respect to the lower electrode 10 and the phase-changed dielectric layer 20. The phase control layer 30 may be completely or partially removed depending on the example embodiment. In an example, a portion of the material constituting the phase control layer 30 may diffuse into the interfacial region 20R of the phase-changed dielectric layer 20. For example, in the interfacial region 20R proximal to the surface 20S of the phase-changed dielectric layer 20, a phase control material may be present. The phase control material may be detected through, for example, Energy Dispersive X-ray Spectroscopy (EDX).

Figure 6:
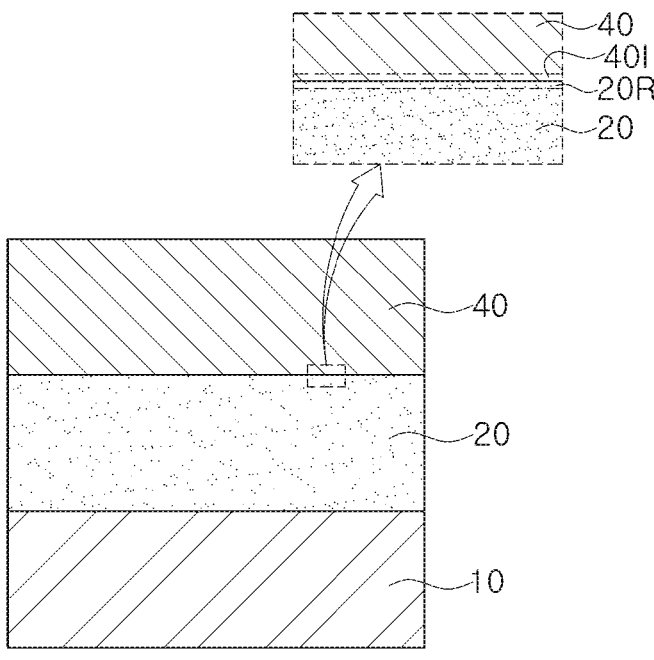

Referring to FIGS. 1 and 6, the upper electrode 40 may be formed on the phase-changed dielectric layer 20 (S60).

The upper electrode 40 may include a conductive material such as a doped semiconductor material, a conductive metal nitride, a metal, a conductive metal oxide, conductive carbon, or combinations thereof. In an example, the upper electrode 40 may be formed of titanium nitride. The upper electrode 40 may be formed after the phase control layer 30 is removed. In detail, after inducing the phase change in the dielectric layer 20, the upper electrode 40 may be formed separately from the phase control layer 30 formed for inducing the phase change. Accordingly, since the upper electrode 40 may be formed of a metal material having a high work function, an increase in leakage current in the data storage structure may be limited and/or prevented. The upper electrode 40 may include an interfacial layer 401 adjacent to the dielectric layer 20, and the interfacial layer 401 may include at least one of tin, molybdenum, niobium, tantalum, titanium, indium, nickel, cobalt, tungsten, ruthenium, zirconium and hafnium, and at least one of oxygen and nitrogen.

Figure 7:
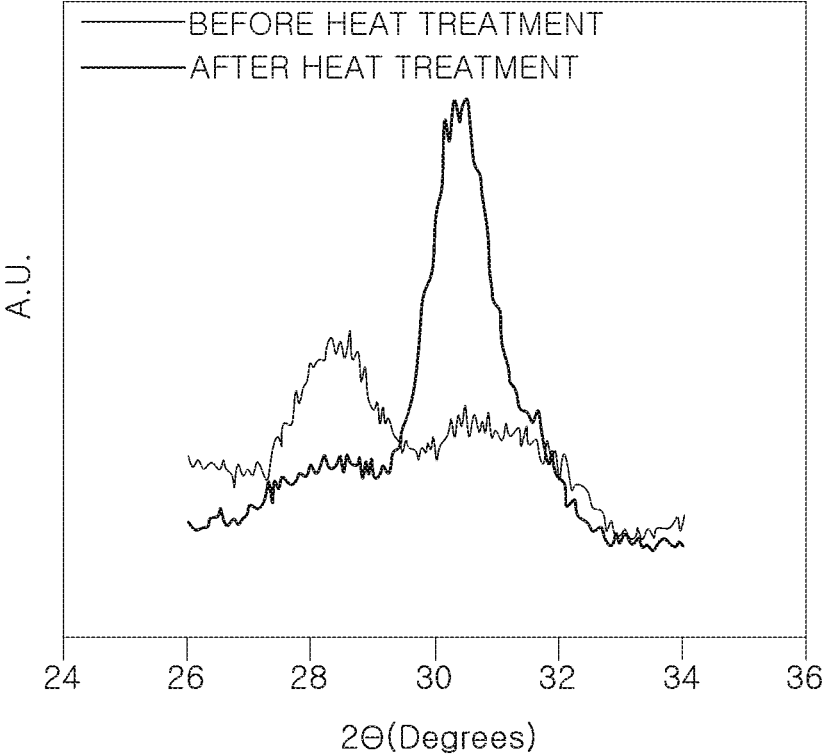
FIG. 7 is data illustrating the results of X-ray diffraction analysis (XRD) for confirming the phase change in the dielectric layer.

FIG. 7 is data illustrating the results of X-ray diffraction analysis (XRD) that may confirm the phase change in the dielectric layer.

Referring to FIG. 7, in the case of the dielectric layer 20' before the heat treatment process, the material constituting the dielectric layer 20 before the heat treatment process has a monoclinic crystal phase, and after the heat treatment process is performed, the material constituting the dielectric layer 20 may have a tetragonal crystal phase or an orthorhombic crystal phase.

Figure 8:
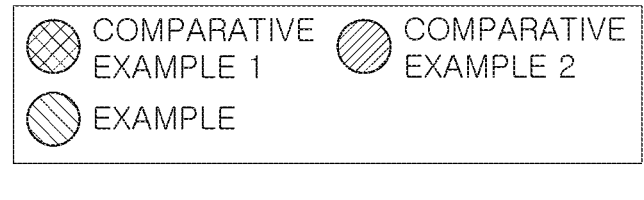
FIG. 8 is data confirming the leakage current and the effective oxide film thickness of the data storage structure according to the example embodiments are reduced.
Figure 8:
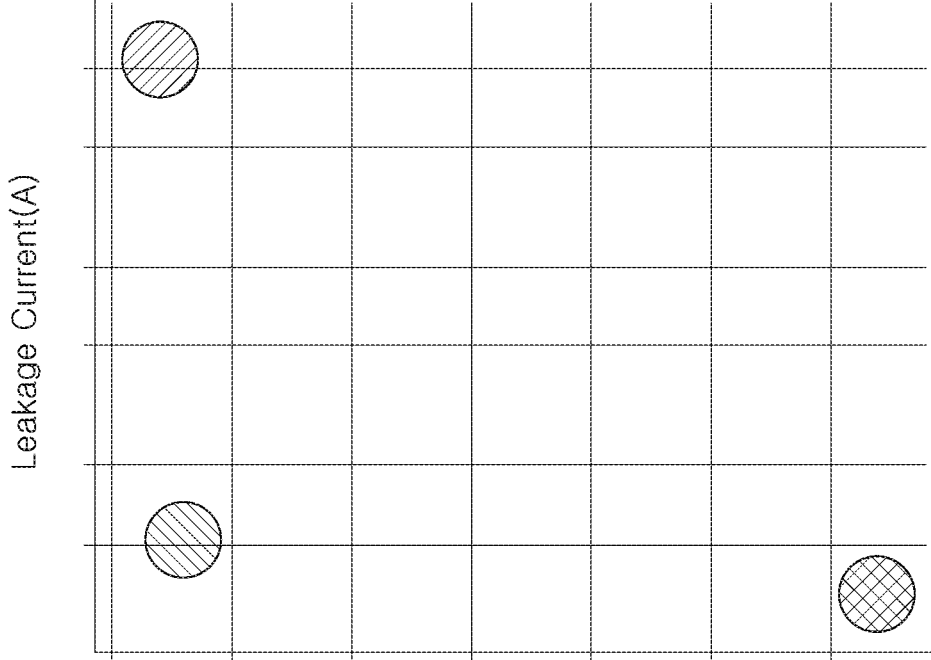

FIG. 8 is data confirming the leakage current and the effective oxide film thickness (also referred to as equivalent oxide thickness) of the data storage structure according to the example embodiments are reduced.

Referring to FIG. 8, it can be seen that in Comparative Example 1 including the dielectric layer in which the phase change is not induced, the dielectric constant of the dielectric layer is relatively low, so that the effective oxide film thickness is thick. In Comparative Example 2, when the phase control layer inducing a phase change in the dielectric layer was not removed, as the dielectric constant of the dielectric layer increases, the effective oxide film thickness decreases, but the work function of the upper electrode is not high, indicating that the leakage current is increased. According to an example embodiment, by forming a phase control layer (S30), changing the phase of the dielectric layer (S40), removing the phase control layer (S50), and forming an upper electrode (S60), the effective oxide film thickness decreases, and an increase in leakage current may be limited and/or prevented by forming an upper electrode having a high work function.

Figure 9:
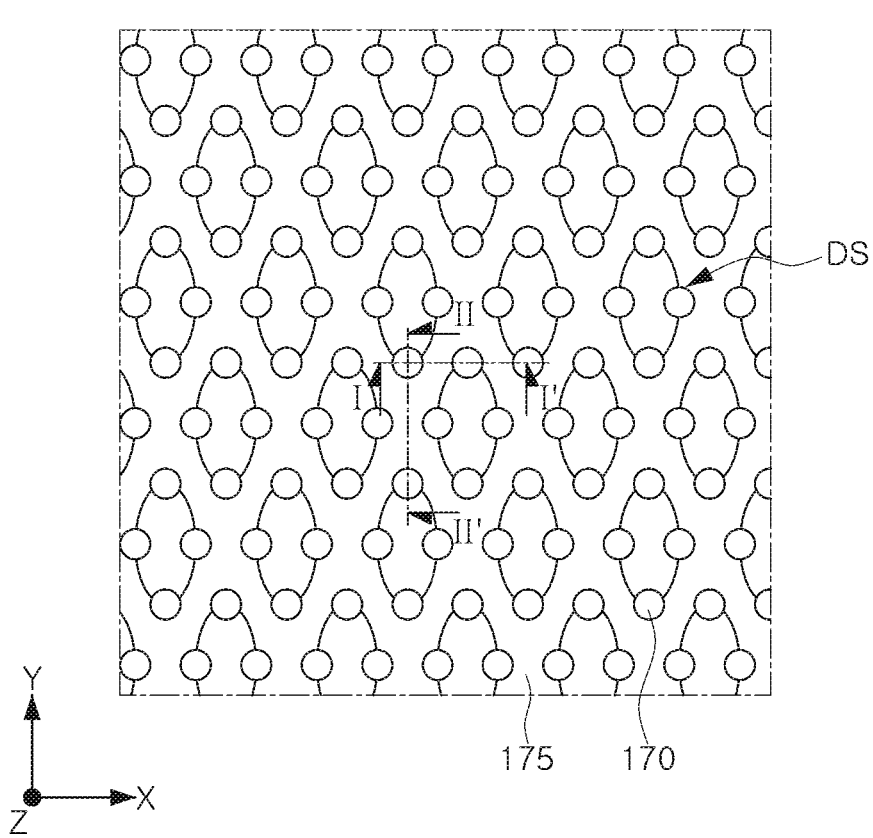
FIG. 9 is a plan view illustrating a semiconductor device according to example embodiments.

FIG. 9 is a plan view illustrating a semiconductor device according to example embodiments.

Figure 10:
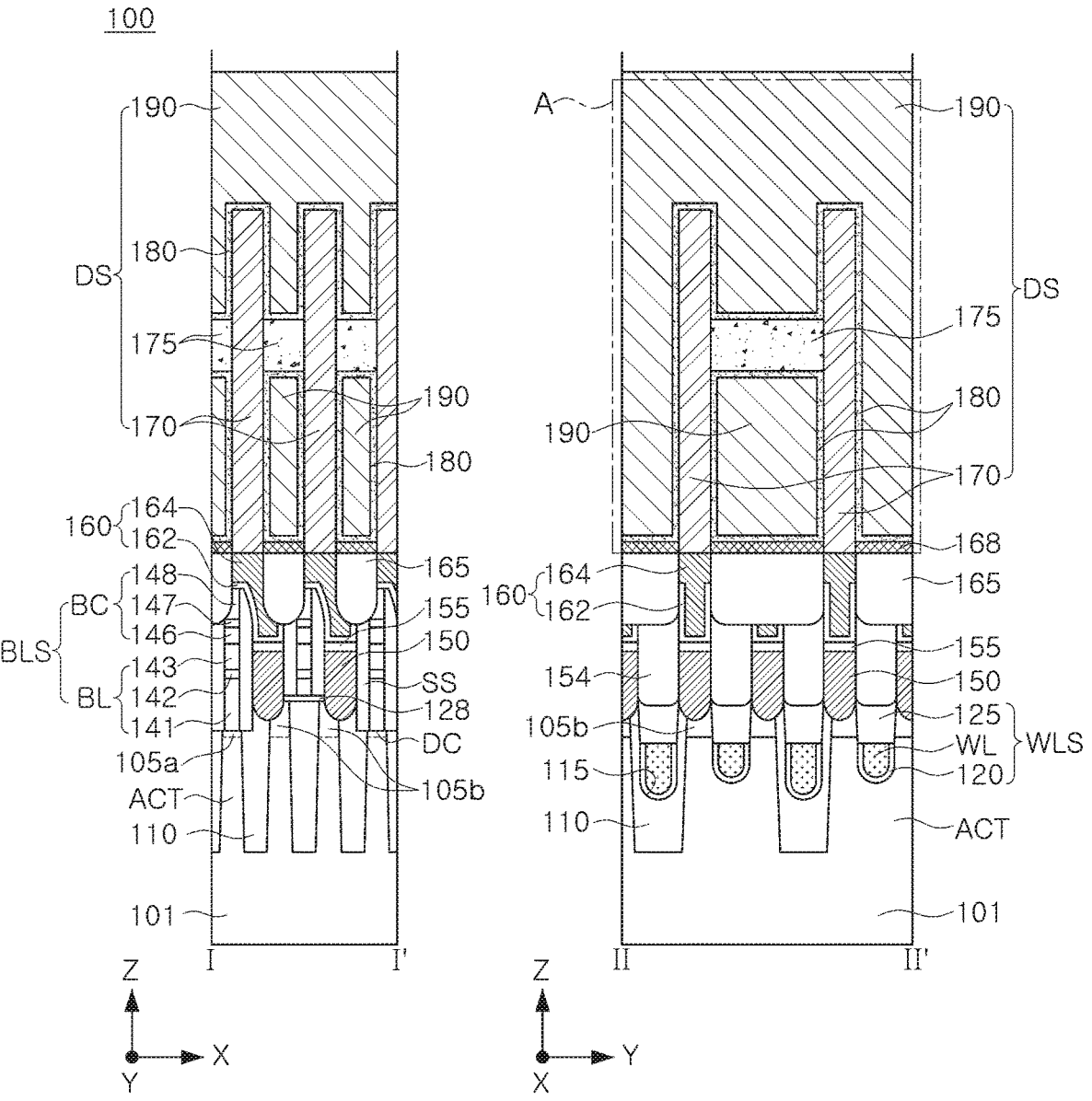
FIG. 10 is a cross-sectional view illustrating a semiconductor device according to example embodiments.

FIG. 10 is a cross-sectional view illustrating a semiconductor device according to example embodiments. FIG. 10 illustrates cross-sections taken along the cutting lines I-I' and II-II' of FIG. 9.

Referring to FIGS. 9 and 10, the semiconductor device 100 may include active regions ACT, a device isolation layer 110, a word line structure WLS, a bit line structure BLS, a spacer structure SS, a conductive contact 150, fence insulating patterns 154, an insulating pattern 165, an etch stop layer 168, and a data storage structure (DS). The semiconductor device 100 may include, for example, a cell array of a dynamic random access memory (DRAM). The data storage structure DS may include lower electrodes 170, a dielectric layer 180, and an upper electrode 190.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may be a substrate including a silicon substrate, a silicon on insulator (all) substrate, a germanium substrate, a germanium on insulator (GOI) substrate, a silicon-germanium substrate, or an epitaxial layer.

The active regions ACT may be defined or defined in the substrate 101 by the device isolation layer 110. The active region ACT may have a bar shape, and may be disposed in an island shape extending in one direction within the substrate 101. The one direction may be a direction inclined with respect to the extension directions of the word lines WL and the bit lines BL. The active regions ACT may be arranged parallel to each other, and an end of one active region ACT may be arranged adjacent to a center of another active region ACT adjacent thereto.

The active region ACT may have first and second impurity regions 105a and 105b having a desired and/or alternatively predetermined depth from the upper surface of the substrate 101. The first and second impurity regions 105a and 105b may be spaced apart from each other. The first and second impurity regions 105a and 105b may serve as source/drain regions of the transistor formed by the word line WL. The source region and the drain region are formed by the first and second impurity regions 105a and 105b by doping or ion implantation with substantially the same impurities, and may be referred to interchangeably depending on the circuit configuration of the finally formed transistor. The impurities may include dopants having a conductivity type opposite to that of the substrate 101. In example embodiments, depths of the first and second impurity regions 105a and 105b in the source region and the drain region may be different from each other.

The device isolation layer 110 may be formed by a shallow trench isolation (STI) process. The device isolation layer 110 surrounds the active regions ACT and may electrically isolate them from each other. The device isolation layer 110 may be formed of an insulating material, for example, silicon oxide, silicon nitride, or combinations thereof. The device isolation layer 110 may include a plurality of regions having different bottom depths according to the width of the trench in which the substrate 101 is etched.

The word line structures WLS may be disposed in the gate trenches 115 extending in the substrate 101. Each of the word line structures WLS may include a gate dielectric layer 120, a word line WL, and a gate capping layer 125. In this specification, the 'gate (120, WL)' may be referred to as a structure including the gate dielectric layer 120 and the word line WL, the word line WL may be referred to as a 'gate electrode', and the word line structure WLS may be referred to as a 'gate structure.'

The word line WL may be disposed to extend in the first direction X across the active region ACT. For example, a pair of adjacent word lines WL may be disposed to cross one active region ACT. The word line WL may constitute a gate of a buried channel array transistor (BCAT), but is not limited thereto. In example embodiments, the word lines WL may have a shape disposed on the substrate 101. The word line WL may be disposed under the gate trench 115 to have a desired and/or alternatively predetermined thickness. The upper surface of the word line WL may be positioned on a level lower than the upper surface of the substrate 101. In this specification, the high and low of the term "level" may be defined based on a substantially flat upper surface of the substrate 101.

The word line (WL) may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al). For example, the word line WL may include a lower pattern and an upper pattern formed of different materials, the lower pattern may include at least one of tungsten (W), titanium (Ti), tantalum (Ta), tungsten nitride (WN), titanium nitride (TiN), and tantalum nitride (TaN), and the upper pattern may be a semiconductor pattern including polysilicon doped with P-type or N-type impurities.

The gate dielectric layer 120 may be disposed on the bottom and inner surfaces of the gate trench 115. The gate dielectric layer 120 may conformally cover the inner wall of the gate trench 115. The gate dielectric layer 120 may include at least one of silicon oxide, silicon nitride, and silicon oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The gate capping layer 125 may be disposed to fill the gate trench 115 on the word line WL. The upper surface of the gate capping layer 125 may be positioned at substantially the same level as the upper surface of the substrate 101. The gate capping layer 125 may be formed of an insulating material, for example, silicon nitride.

The bit line structure BLS may extend in one direction, for example, the second direction Y, perpendicular to the word line WL. The bit line structure BLS may include a bit line BL and a bit line capping pattern BC on the bit line BL.

The bit line BL may include a first conductive pattern 141, a second conductive pattern 142, and a third conductive pattern 143 that are sequentially stacked. The bit line capping pattern BC may be disposed on the third conductive pattern 143. A buffer insulating layer 128 may be disposed between the first conductive pattern 141 and the substrate 101, and a portion of the first conductive pattern 141 (hereinafter, the bit line contact pattern DC) may contact the first impurity region 105a of the active region ACT. The bit line BL may be electrically connected to the first impurity region 105a through the bit line contact pattern DC. The lower surface of the bit line contact pattern DC may be positioned on a level lower than the upper surface of the substrate 101, and may be located at a level higher than the upper surface of the word line WL. In an example embodiment, the bit line contact pattern DC may be formed in the substrate 101 to be locally disposed in the bit line contact hole exposing the first impurity region 105a.

The first conductive pattern 141 may include a semiconductor material such as polycrystalline silicon. The first conductive pattern 141 may directly contact the first impurity region 105a. The second conductive pattern 142 may include a metal-semiconductor compound. The metal-semiconductor compound may be, for example, a layer in which a portion of the first conductive pattern 141 is silicided. For example, the metal-semiconductor compound may include cobalt silicide (CoSi), titanium silicide (TiSi), nickel silicide (NiSi), tungsten silicide (WSi), or other metal silicides. The third conductive pattern 143 may include a metal material such as titanium (Ti), tantalum (Ta), tungsten (W), and aluminum (Al). The number of conductive patterns constituting the bit line BL, the type of material, and/or the stacking order may be variously changed according to embodiments.

The bit line capping pattern BC may include a first capping pattern 146, a second capping pattern 147, and a third capping pattern 148 sequentially stacked on the third conductive pattern 143. Each of the first to third capping patterns 146, 147, and 148 may include an insulating material, for example, a silicon nitride layer. The first to third capping patterns 146, 147, and 148 may be formed of different materials, and even if they include the same material, boundaries may be distinguished by differences in physical properties. A thickness of the second capping pattern 147 may be smaller than a thickness of the first capping pattern 146 and a thickness of the third capping pattern 148, respectively. The number of capping patterns and/or the type of material constituting the bit line capping pattern BC may be variously changed according to embodiments.

The spacer structures SS may be disposed on both sidewalls of each of the bit line structures BLS to extend in one direction, for example, the Y-direction. The spacer structures SS may be disposed to extend along sidewalls of the bit line BL and sidewalls of the bit line capping pattern BC. A pair of spacer structures SS disposed on both sides of one bit line structure BLS may have an asymmetric shape with respect to the bit line structure BLS. Each of the spacer structures SS may include a plurality of spacer layers, and may further include an air spacer according to embodiments.

The lower conductive pattern 150 may be connected to one region of the active region ACT, for example, the second impurity region 105b. The lower conductive pattern 150 may be disposed between the bit lines BL and between the word lines WL. The lower conductive pattern 150 may pass through the buffer insulating layer 128 to be connected to the second impurity region 105b of the active region ACT. The lower conductive pattern 150 may directly contact the second impurity region 105b. The lower surface of the lower conductive pattern 150 may be located at a level lower than the upper surface of the substrate 101, and may be located at a higher level than the lower surface of the bit line contact pattern DC. The lower conductive pattern 150 is a spacer. The structure SS may be insulated from the bit line contact pattern DC. The lower conductive pattern 150 may be formed of a conductive material, for example, polycrystalline silicon (Si), titanium (Ti), titanium nitride (TiN), tantalum (Ta), tantalum nitride (TaN), tungsten (W), tungsten nitride (WN), and aluminum (Al). In an example embodiment, the lower conductive pattern 150 may include a plurality of layers.

A metal-semiconductor compound layer 155 may be disposed between the lower conductive pattern 150 and the upper conductive pattern 160. The metal-semiconductor compound layer 155 may be, for example, a layer in which a portion of the lower conductive pattern 150 is silicided when the lower conductive pattern 150 includes a semiconductor material. The metal-semiconductor compound layer 155 may include, for example, cobalt silicide (CoSi), titanium silicide (TiSi), nickel silicide (NiSi), tungsten silicide (WSi), or other metal silicide. In some embodiments, the metal-semiconductor compound layer 155 may be omitted.

The fence insulating patterns 154 may be disposed on a side surface of the lower conductive pattern 150. The fence insulating patterns 154 may be spaced apart from each other in the Y-direction between the bit line structures BLS. The fence insulating patterns 154 may vertically overlap the word line structures WLS. The fence insulating patterns 154 may be disposed between the bit line structures BLS in the X-direction and between the lower conductive patterns 150 in the Y-direction in a plan view.

The upper conductive pattern 160 may be disposed on the lower conductive pattern 150. The upper conductive pattern 160 may extend between the spacer structures SS to cover the upper surface of the metal-semiconductor compound layer 155. The upper conductive pattern 160 may include a barrier layer 162 and a conductive layer 164. The barrier layer 162 may cover a lower surface and side surfaces of the conductive layer 164. The barrier layer 162 may include a metal nitride, for example, at least one of titanium nitride (TiN), tantalum nitride (TaN), and tungsten nitride (WN). The conductive layer 164 may include a conductive material, for example, at least one of polycrystalline silicon (Si), titanium (Ti), tantalum (Ta), tungsten (W), ruthenium (Ru), copper (Cu), molybdenum (Mo), Platinum (Pt), nickel (Ni), cobalt (Co), aluminum (Al), titanium nitride (TiN), tantalum nitride (TaN), and tungsten nitride (WN).

The insulating patterns 165 may be disposed to penetrate the upper conductive pattern 160. A plurality of upper conductive patterns 160 may be separated by insulating patterns 165. The insulating patterns 165 may include an insulating material, for example, at least one of silicon oxide, silicon nitride, and silicon oxynitride.

The etch stop layer 168 may cover the insulating patterns 165 between the lower electrodes 170. The etch stop layer 168 may contact lower regions of side surfaces of the lower electrodes 170. The etch stop layer 168 may be disposed below the support layer 175. The etch stop layer 168 may include, for example, at least one of silicon nitride and silicon oxynitride.

The lower electrodes 170 may be disposed on the upper conductive patterns 160. The lower electrodes 170 may penetrate the etch stop layer 168 to contact the upper conductive patterns 150. The lower electrodes 170 may have a cylindrical shape or a hollow cylinder or cup shape. At least one support layer 175 supporting the lower electrodes 170 may be provided between the adjacent lower electrodes 170. The lower electrodes 170 may include at least one of a doped semiconductor material, a conductive metal nitride, a metal, and a conductive metal oxide.

The support layer 175 contacts the lower electrodes 170 and may extend in a direction parallel to the upper surface of the substrate 101. The support layer 175 may be layers supporting the lower electrodes 170 having a high aspect ratio. The support layer 175 may include holes exposing side surfaces of the four lower electrodes 170 adjacent to each other. Each of the support layers 175 may be formed of, for example, a single layer or multiple layers of at least one of silicon nitride, silicon boron nitride, silicon carbonitride, and silicon oxynitride. The number, thickness, and/or arrangement relationship of the support layers 175 is not limited to the illustrated ones, and may be variously changed according to embodiments.

The dielectric layer 180 may be disposed on the lower electrodes 170. The dielectric layer 180 may be formed with a uniform thickness on the surfaces of the lower electrodes 170. The dielectric layer 180 may include, for example, silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

In an example, dielectric layer 180 may include a phase control material disposed along a surface of dielectric layer 180. For example, the dielectric layer 180 may include a first surface in contact with the lower electrode 170 and a second surface in contact with the upper electrode 190, and the phase control material may be disposed along the second surface. The phase control material may include a semiconductor material, a conductive metal nitride (e.g., titanium nitride, tantalum nitride, molybdenum nitride, cobalt nitride, niobium nitride, tungsten nitride, or the like), a metal (e.g., molybdenum, cobalt, zirconium, niobium, titanium, copper, tantalum, vanadium, aluminum, scandium, chromium, manganese, nickel, rubidium, strontium, ruthenium, indium, tin, tungsten, iridium, or lanthanum), or combinations thereof.

The upper electrode 190 may be disposed on the dielectric layer 180. The upper electrode 190 may include a conductive material such as a doped semiconductor material, a conductive metal nitride, a metal, a conductive metal oxide, conductive carbon, or combinations thereof.

FIGS. 11A to 11H are cross-sectional views illustrating a method of manufacturing a semiconductor device according to example embodiments. 11A to 11H illustrate an enlarged area corresponding to area 'A' in FIG. 10.

Figure 11A:
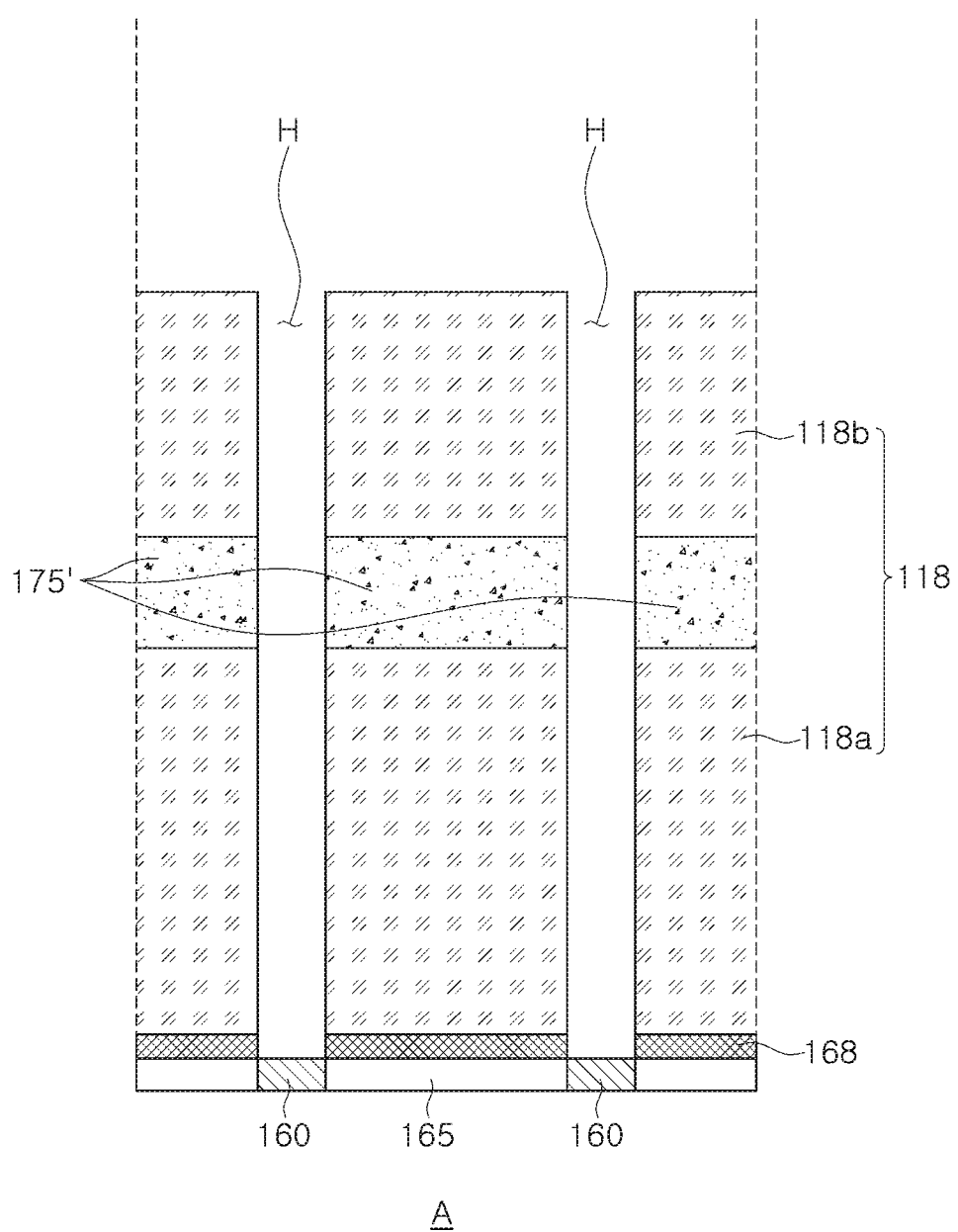
FIGS. 11A to 11H are cross-sectional views illustrating a method of manufacturing a semiconductor device according to example embodiments.

First, referring to FIGS. 10 and 11A, a method of manufacturing a semiconductor device may include forming the device isolation layer 110 and the active region ACT on the substrate 101, forming impurity regions 105a, 105b, forming a word line structure (WLS) after forming the gate trench 115, forming a bit line structure (BLS) on the substrate 101, forming a spacer structure (SS) on a side surface of the bit line structure (BLS), forming fence insulating patterns 154 between the spacer structures SS, forming conductive patterns 150, 155, 160 between the fence insulating patterns 155, forming insulating patterns 165 penetrating a portion of the conductive patterns 150, 155 and 160, forming an etch stop layer 168 on the insulating patterns 165, forming mold layers 118a, 118b and a preliminary support layer 175' on the etch stop layer 168, and forming a plurality of holes H through the mold layers 118a and 118b and the preliminary support layer 175'.

Figure 11B:
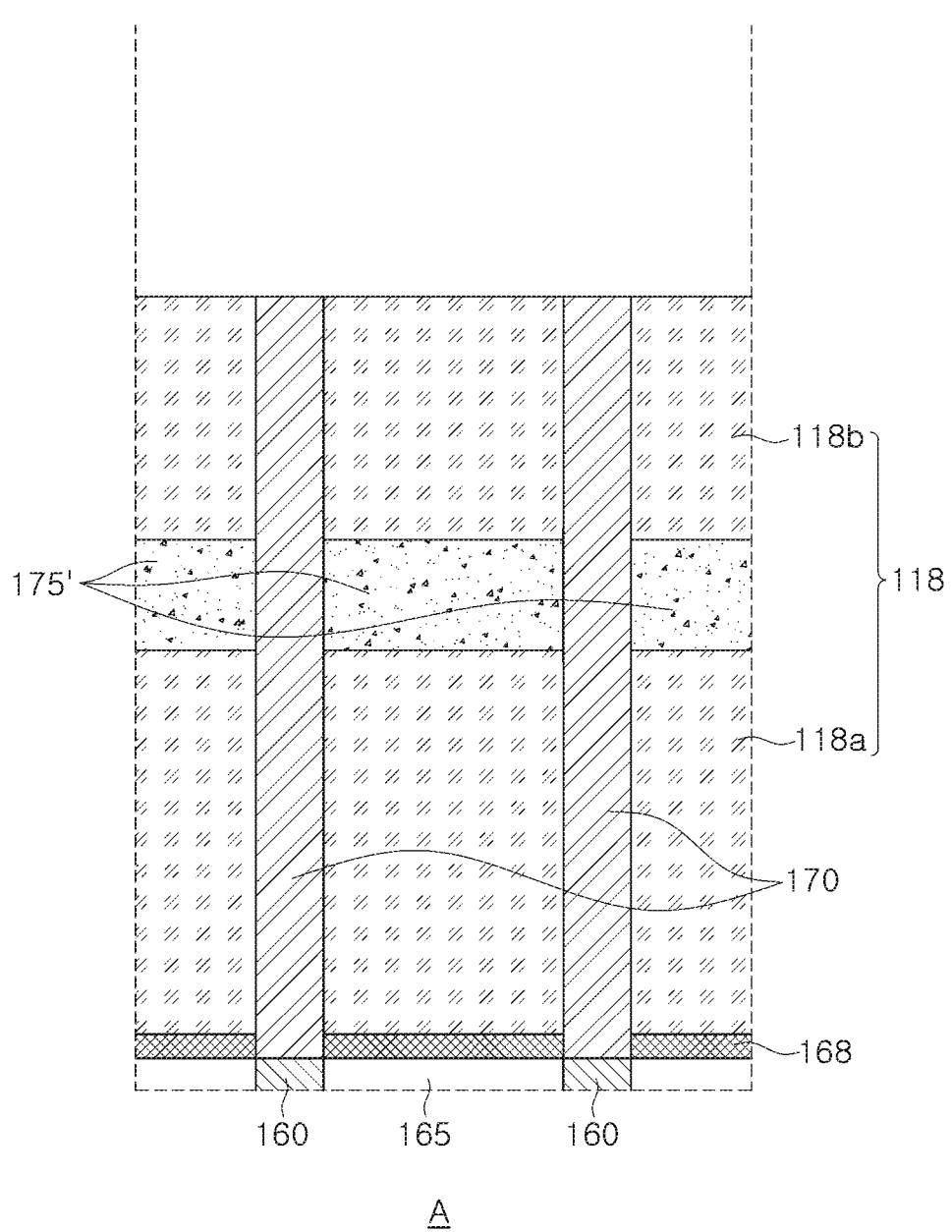

Referring to FIG. 11B, the lower electrodes 170 may be formed by depositing a conductive material in the plurality of holes H.

Figure 11C:
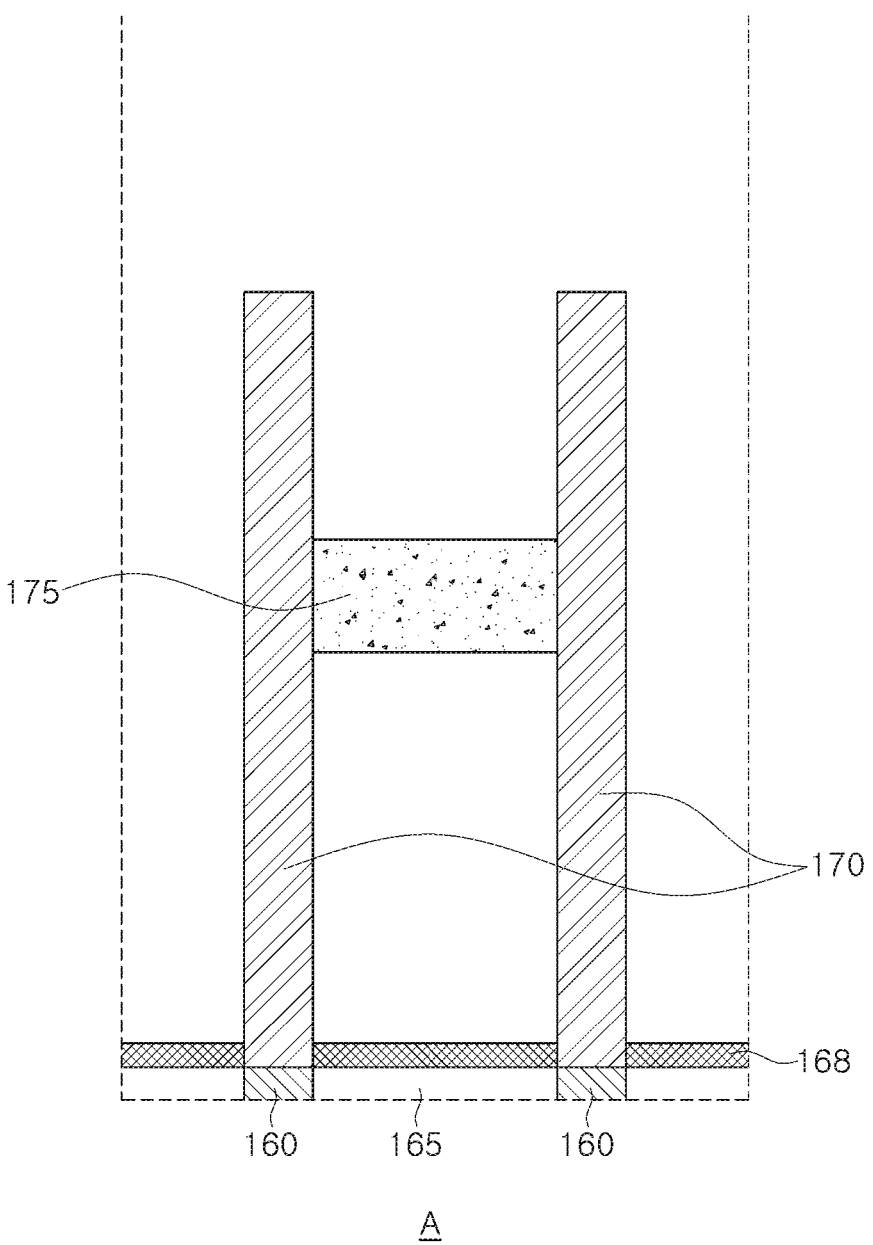

Referring to FIG. 11C, after forming a mask including an opening partially exposing the upper surfaces of the lower electrodes 170 on the mold layers 118a and 118b, the mold layers 118a and 118b and the preliminary support layer 175' may be etched. The preliminary support layer 175' may be partially etched to form a support layer 175 supporting the lower electrodes 170. Mold layers 118a, 118b may be removed.

Figure 11D:
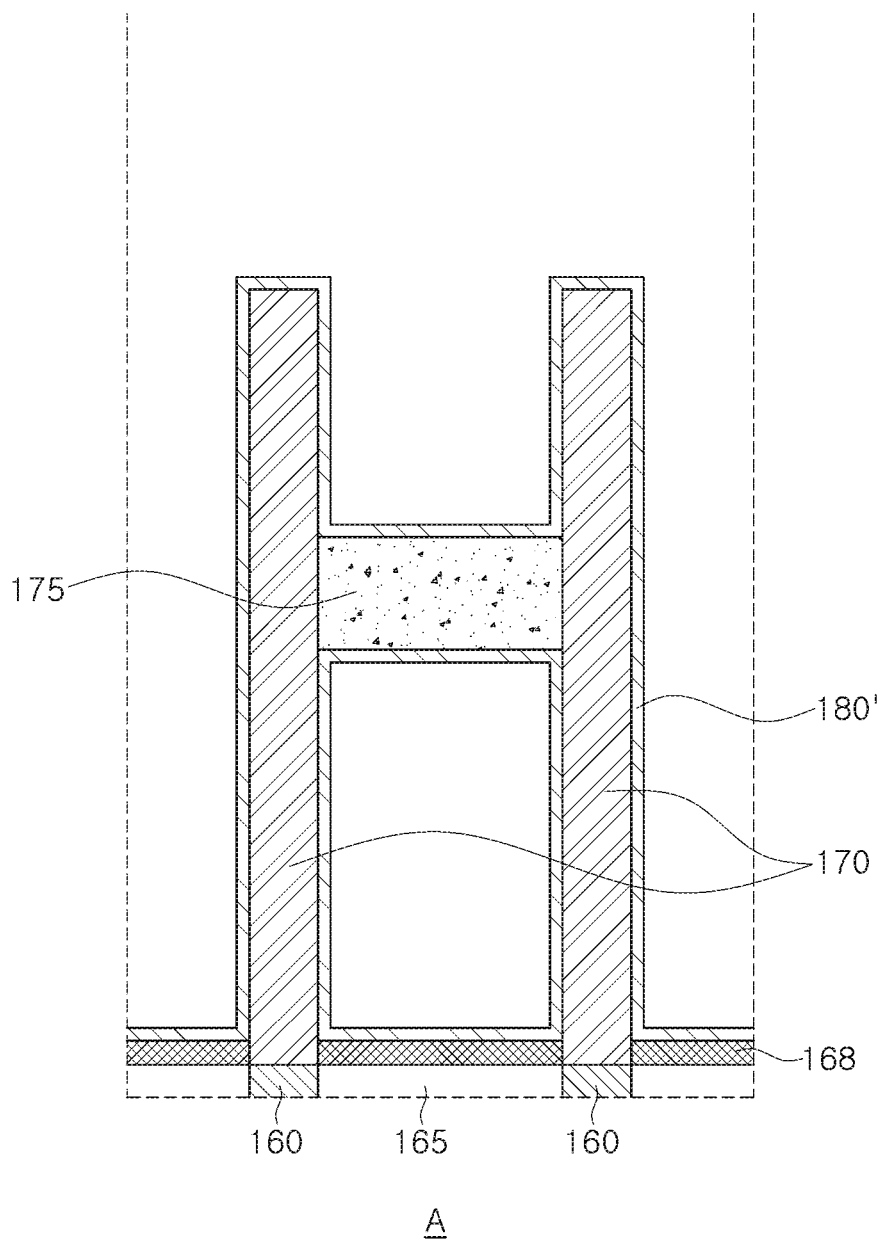

Referring to FIG. 11D, a dielectric layer 180' may be formed on the lower electrodes 170. Dielectric layer 180' may be formed as a monoclinic crystal phase on lower electrodes 170.

Figure 11E:
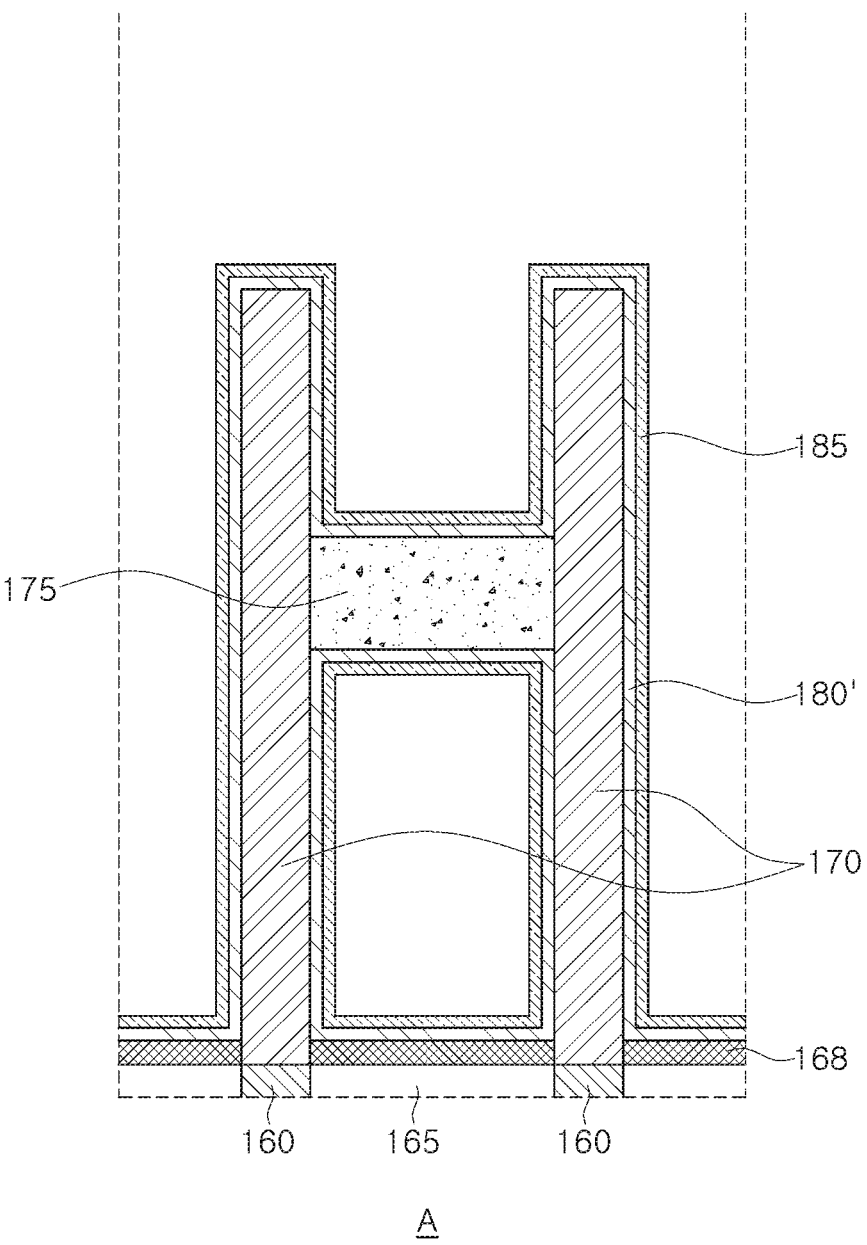

Referring to FIG. 11E, a phase control layer 185 may be formed on the dielectric layer 180'. The phase control layer 185 may include a material that induces a phase change in the dielectric layer 180'.

Figure 11F:
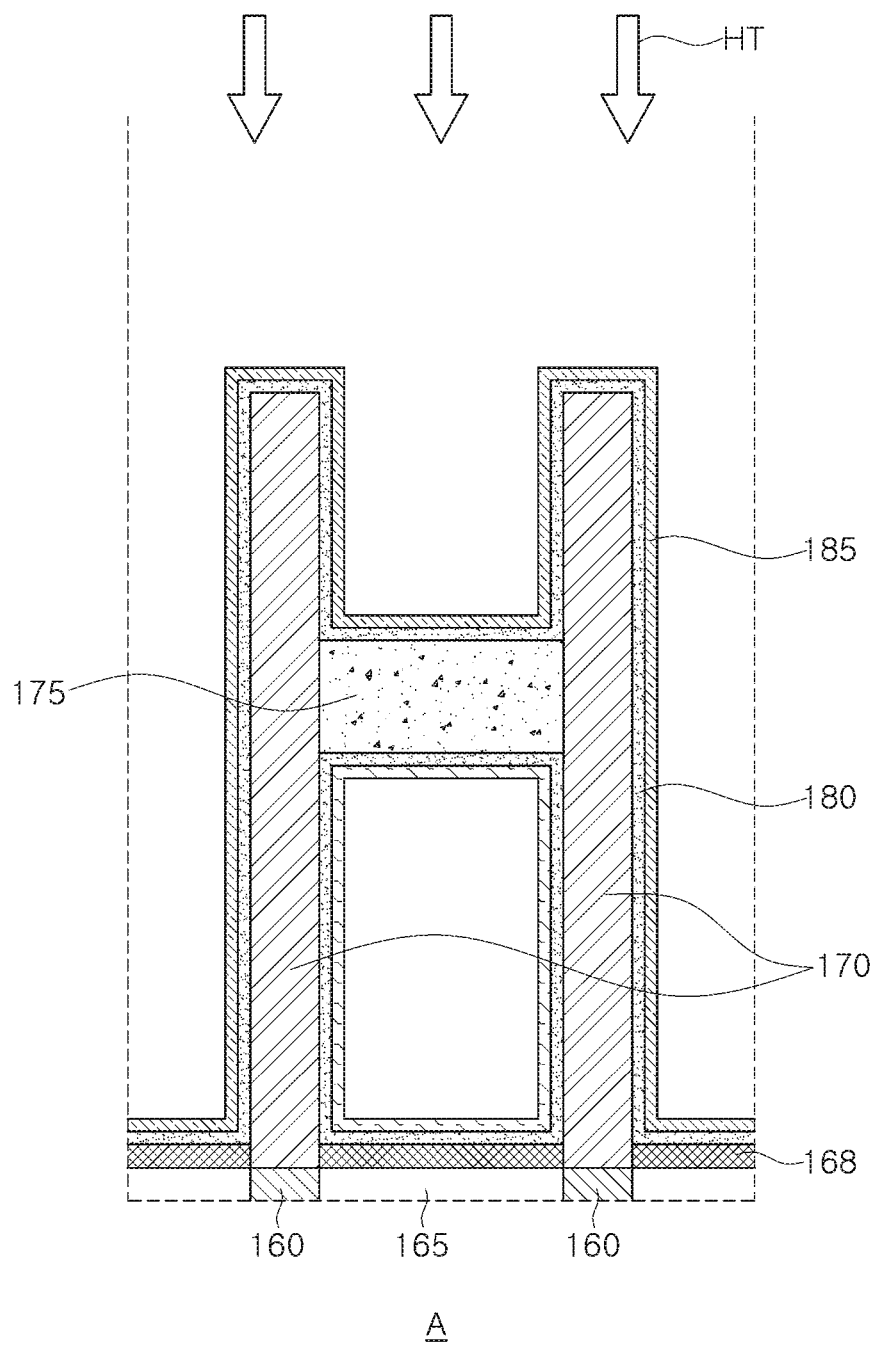

Referring to FIG. 11F, a phase change in a material constituting the dielectric layer 180' may be induced by performing a heat treatment process (HT). The material constituting the dielectric layer 180' may have a phase change induced by the phase control layer 185 during the heat treatment process (HT). The dielectric layer 180' may be changed to the phase-changed dielectric layer 180.

Figure 11G:
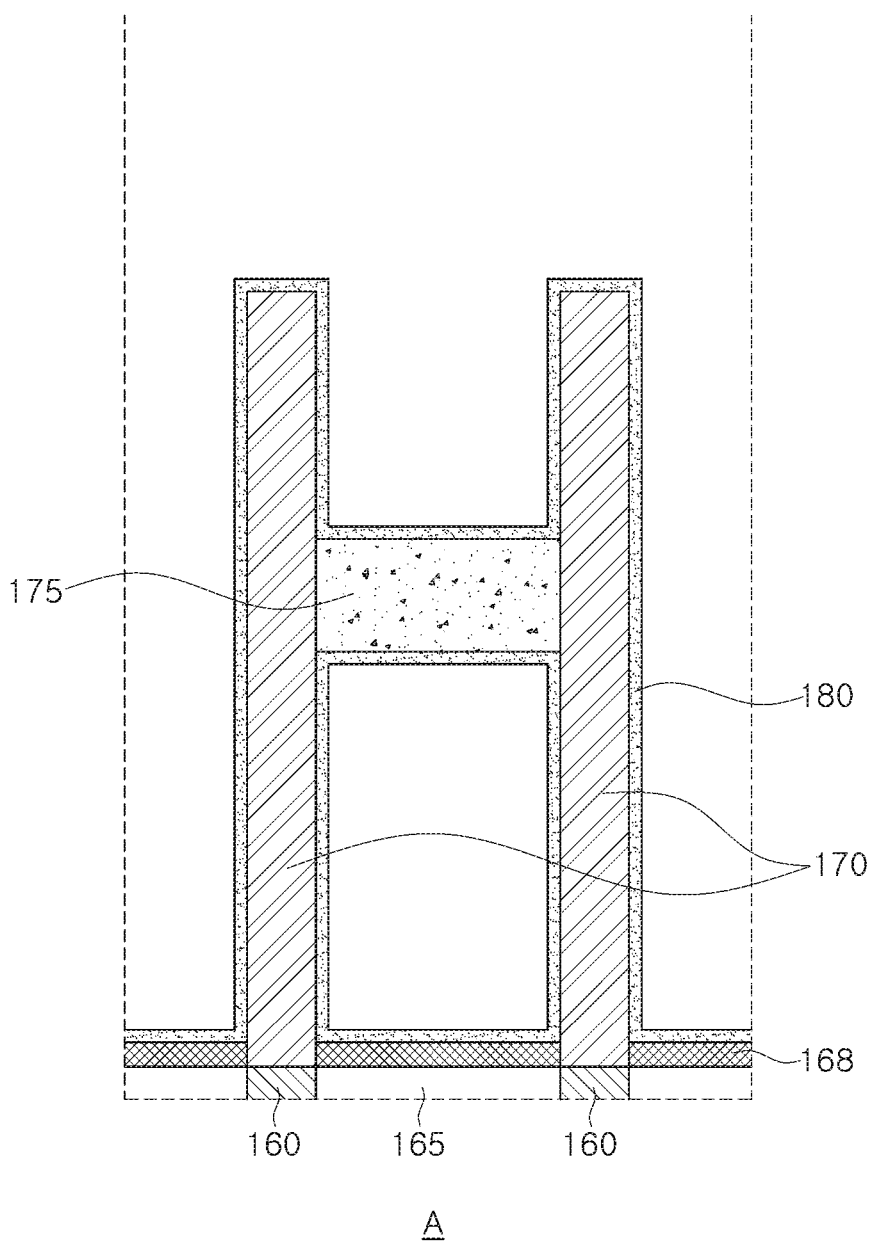

Referring to FIG. 11G, the phase control layer 185 may be removed. The phase control layer 185 may be removed by, for example, a wet etching process. A portion of the material constituting the phase control layer 185 may diffuse into a region close to the surface of the phase-changed dielectric layer 180.

Figure 11H:
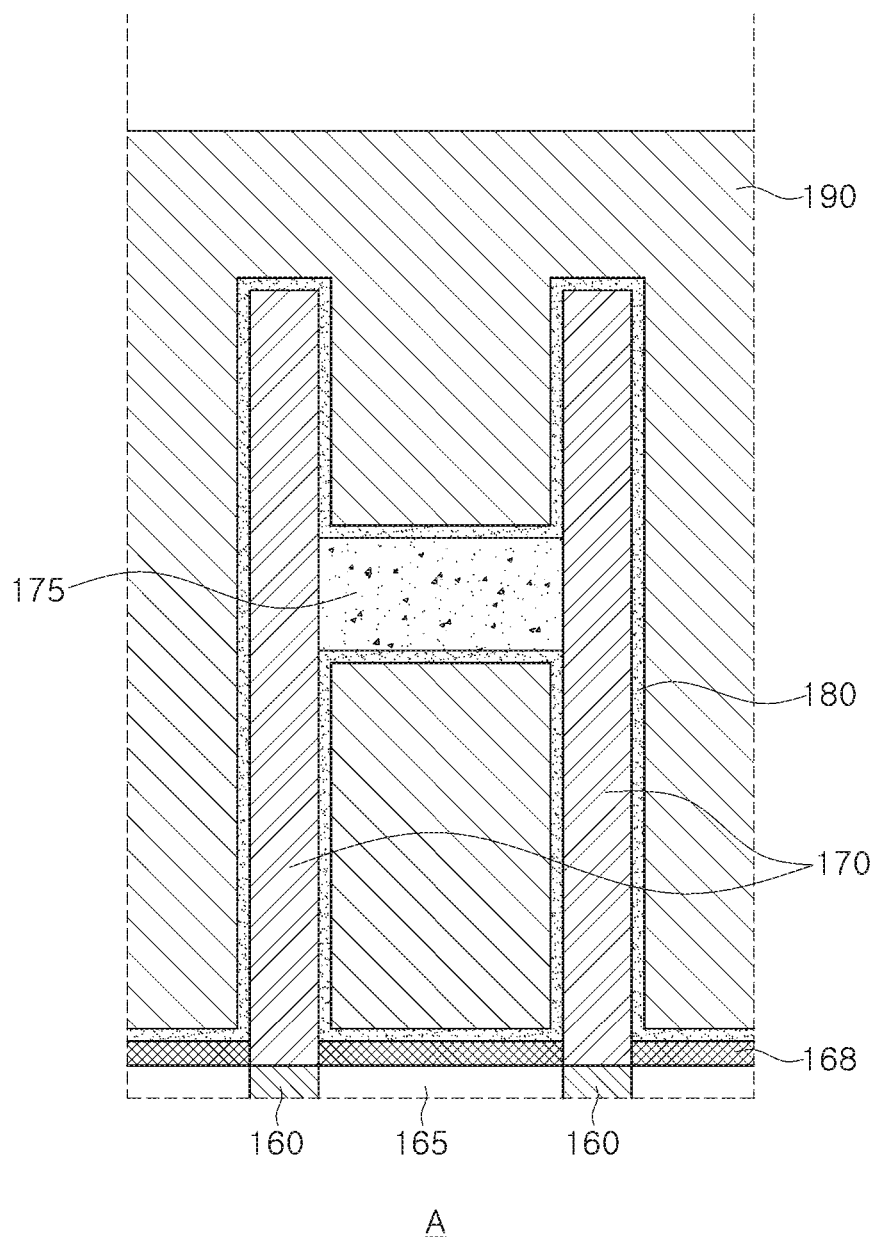

Referring to FIG. 11H, the upper electrode 190 may be formed on the phase-changed dielectric layer 180.

Figure 12A:
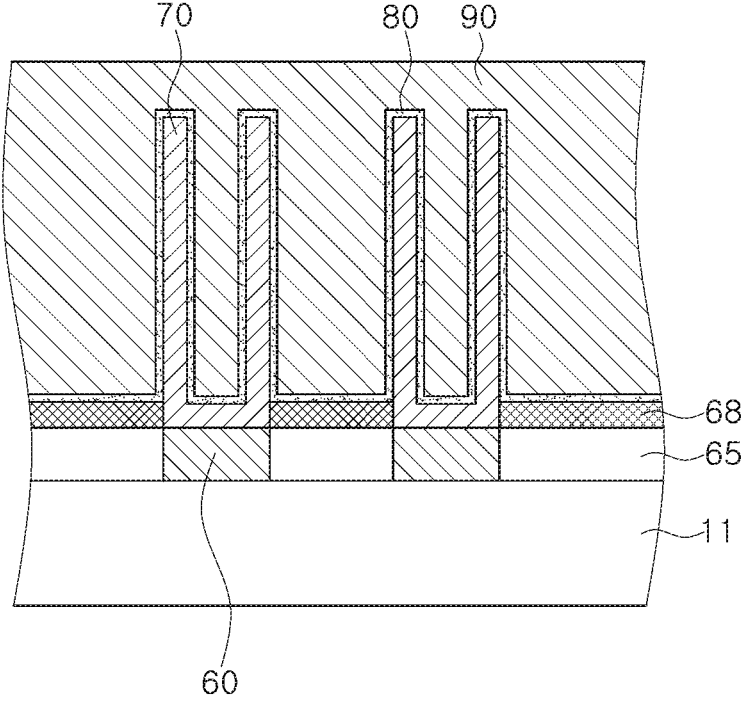
FIGS. 12A and 12B are cross-sectional views illustrating semiconductor devices according to example embodiments.
Figure 12B:
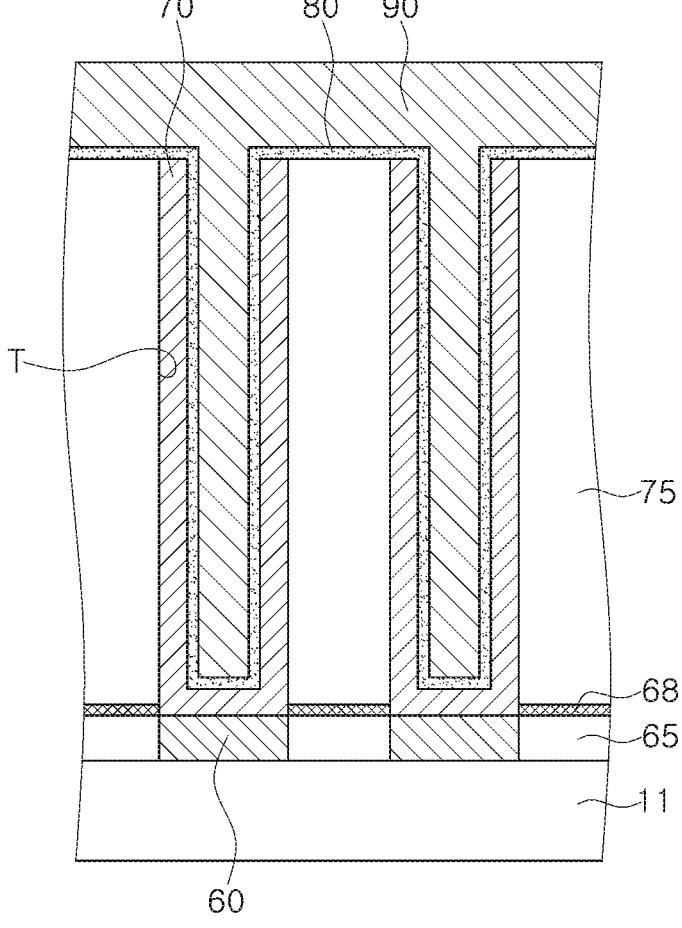

FIGS. 12A and 12B are cross-sectional views illustrating semiconductor devices according to example embodiments.

Referring to FIG. 12A, a lower contact 60 and an insulating layer 65 may be disposed on the substrate 11. An etch stop layer 68 may be disposed on the insulating layer 65. The lower electrode 70 may penetrate the etch stop layer 68 to be in contact with the lower contact 60. The lower electrode 70 may have a hollow cup/cylinder shape. A dielectric layer 80 may be disposed on the lower electrode 70, and an upper electrode 90 may be disposed on the dielectric layer 80. A phase change in the dielectric layer 80 may be induced during a heat treatment process by a separate phase control layer. After the dielectric layer 80 is phase changed, the separate phase control layer is removed, and an upper electrode 90 may be formed on the phase-changed dielectric layer 80.

Referring to FIG. 12B, a lower contact 60 and an insulating layer 65 may be disposed on the substrate 11. An etch stop layer 68 may be disposed on the insulating layer 65. A mold layer 75 may be disposed on the etch stop layer 68. The mold layer 75 may include a contact hole T exposing the lower contact 60. A lower electrode 70 may be disposed in the contact hole T. The lower electrode 70 may have a hollow cup/cylinder shape. The upper surface of the lower electrode 70 may be coplanar with the upper surface of the mold layer 75. A dielectric layer 80 may be disposed on the lower electrode 70, and an upper electrode 90 may be disposed on the dielectric layer 80. A phase change in the dielectric layer 80 may be induced during a heat treatment process by a separate phase control layer. After the dielectric layer 80 is phase-changed, the separate phase control layer may be removed, and the upper electrode 90 may be formed on the phase-changed dielectric layer 80.

Figure 13:
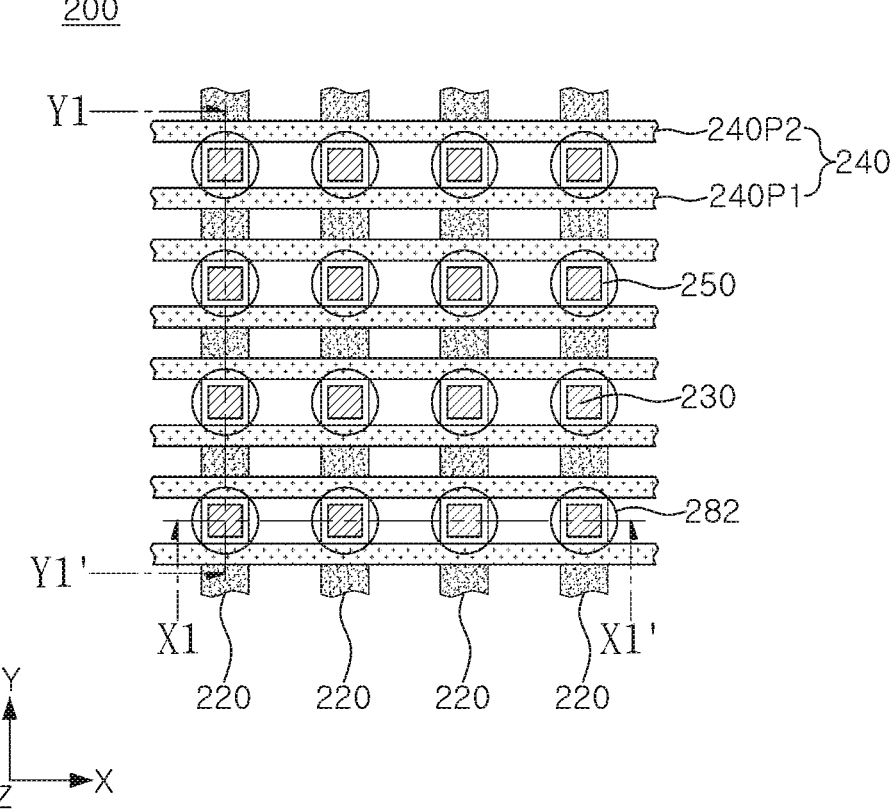
FIG. 13 is a layout diagram illustrating an integrated circuit device according to example embodiments.

FIG. 13 is a layout diagram illustrating an integrated circuit device according to example embodiments.

Figure 14:
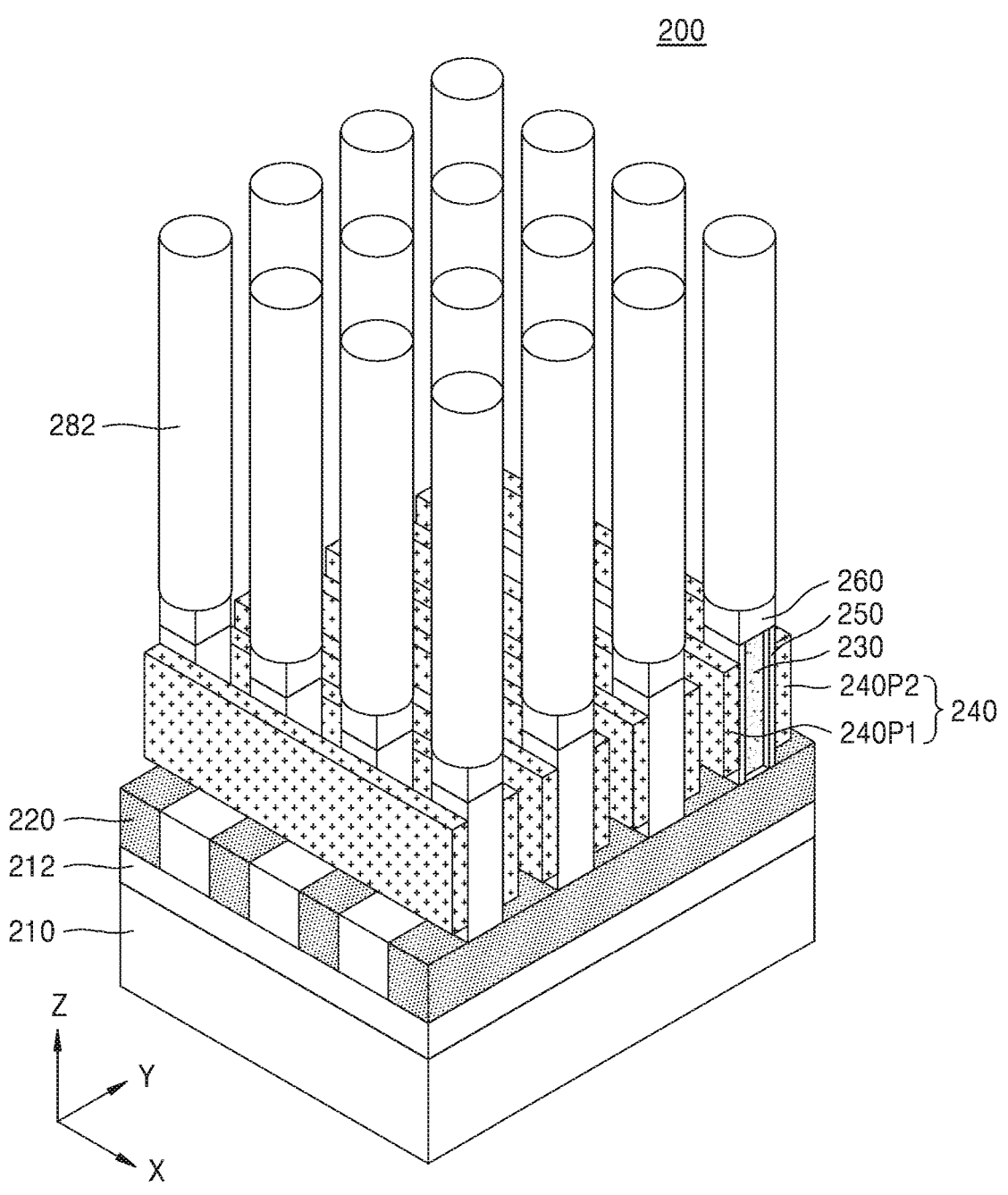
FIG. 14 is a perspective view illustrating an integrated circuit device according to example embodiments.

FIG. 14 is a perspective view illustrating an integrated circuit device according to example embodiments.

Figure 15:
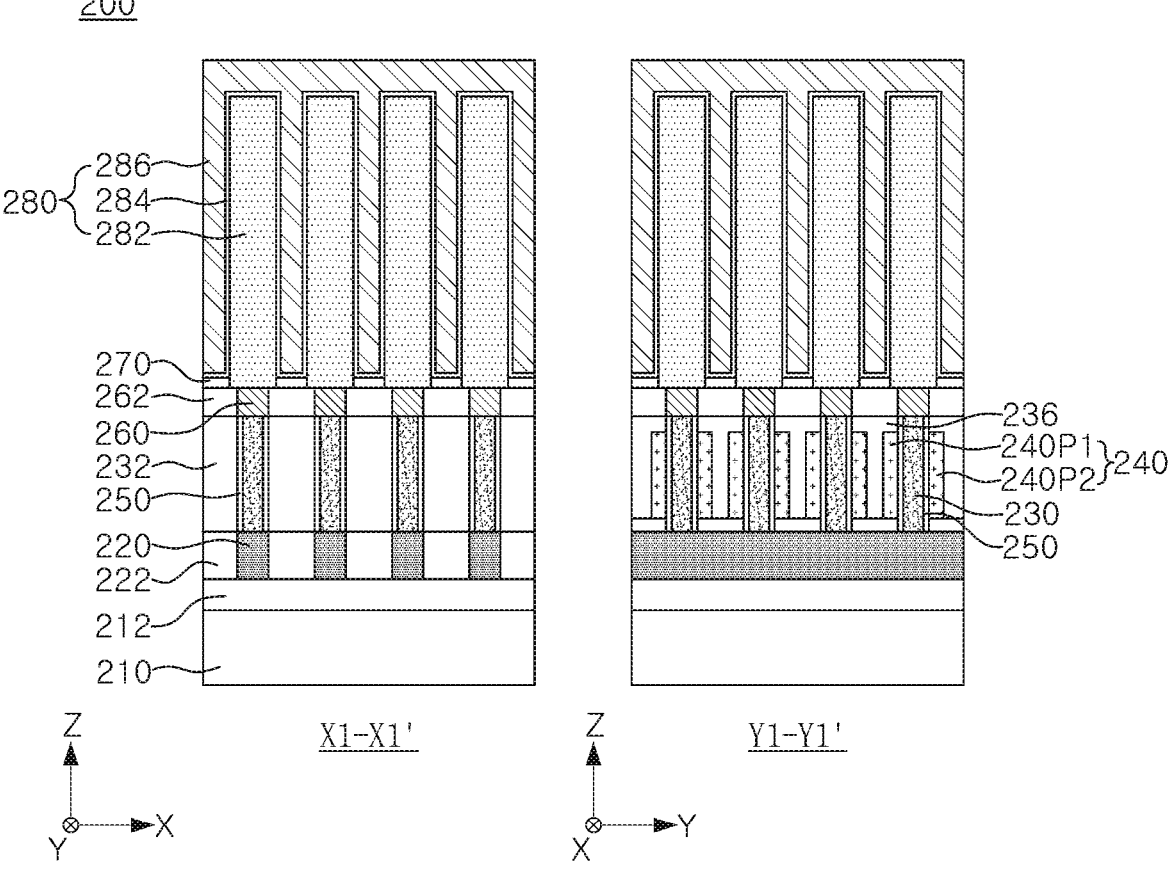
FIG. 15 is a cross-sectional view illustrating an integrated circuit device according to example embodiments.

FIG. 15 is a cross-sectional view of an integrated circuit device according to example embodiments. FIG. 15 is a cross-sectional view taken along line X1-X1' and Y1-Y1' of FIG. 13.

Referring to FIGS. 13 to 15, the integrated circuit device 200 may include the substrate 210, the plurality of first conductive lines 220, the channel layer 230, the gate electrode 240, the gate insulating layer 250, and the data storage structure 280. The integrated circuit device 200 may be a memory device including a vertical channel transistor (VCT). The vertical channel transistor may refer to a structure in which the channel length of the channel layer 230 extends from the substrate 210 in a vertical direction.

A lower insulating layer 212 may be disposed on the substrate 210, and a plurality of first conductive lines 220 may be spaced apart from each other in a first direction (X-direction) and extend in a second direction (Y-direction) on the lower insulating layer 212. A plurality of first insulating patterns 222 may be disposed on the lower insulating layer 212 to fill a space between the plurality of first conductive lines 220. The plurality of first insulating patterns 222 may extend in a second direction (Y-direction), and upper surfaces of the plurality of first insulating patterns 222 may be disposed at the same level as upper surfaces of the plurality of first conductive lines 220. The plurality of first conductive lines 220 may function as bit lines of the integrated circuit device 200.

In example embodiments, the plurality of first conductive lines 220 may include doped polysilicon, metal, conductive metal nitride, conductive metal silicide, conductive metal oxide, or combinations thereof. For example, the plurality of first conductive lines 220 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or combinations thereof, but inventive concepts are not limited thereto. The plurality of first conductive lines 220 may include a single layer or multiple layers of the aforementioned materials. In example embodiments, the plurality of first conductive lines 220 may include a two-dimensional semiconductor material, and for example, the 2D semiconductor material may include graphene, carbon nanotube, or combinations thereof.

The channel layer 230 may be arranged in a matrix form spaced apart from each other in the first direction (X-direction) and the second direction (Y-direction) on the plurality of first conductive lines 220. The channel layer 230 may have a first width in a first direction (X-direction) and a first height in a third direction (Z-direction), and the first height may be greater than the first width. For example, the first height may be about 2 to 10 times the first width, but is not limited thereto. The bottom portion of the channel layer 230 functions as a first source/drain region (not illustrated), an upper portion of the channel layer 230 functions as a second source/drain region (not illustrated), and a portion of the channel layer 230 between the first and second source/drain regions may function as a channel region (not illustrated).

In example embodiments, the channel layer 230 may include an oxide semiconductor, and for example, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Zn$_y$Sn$_z$O, Sn$_x$O, Hf$_x$In$_y$Zn$_z$O, Ga$_x$Zn$_y$Sn$_z$O, Al$_x$Zn$_y$Sn$_z$O, Yb$_x$Ga$_y$Zn$_z$O, In$_x$Ga$_y$O, or combinations thereof. The channel layer 230 may include a single layer or multiple layers of the oxide semiconductor. In some examples, the channel layer 230 may have a bandgap energy greater than that of silicon. For example, the channel layer 230 may have a bandgap energy of about 1.5 eV to about 5.6 eV. For example, the channel layer 230 may have optimal channel performance when it has a bandgap energy of about 2.0 eV to 4.0 eV. For example, the channel layer 230 may be polycrystalline or amorphous, but is not limited thereto. In example embodiments, the channel layer 230 may include a two-dimensional semiconductor material, and for example, the 2D semiconductor material may include graphene, carbon nanotube, or combinations thereof.

The gate electrode 240 may extend in the first direction (X-direction) on both sidewalls of the channel layer 230. The gate electrode 240 may include a first sub-gate electrode 240P1 facing the first sidewall of the channel layer 230, and a second sub-gate electrode 240P2 facing the second sidewall opposite to the first sidewall of the channel layer 230. As one channel layer 230 is disposed between the first sub-gate electrode 240P1 and the second sub-gate electrode 240P2, the integrated circuit device 200 may have a dual gate transistor structure. However, inventive concepts are not limited thereto, and only the first sub-gate electrode 240P1 facing the first sidewall of the channel layer 230 is formed while the second sub-gate electrode 240P2 is omitted. A single gate transistor structure may be implemented.

The gate electrode 240 may include doped polysilicon, metal, conductive metal nitride, conductive metal silicide, conductive metal oxide, or combinations thereof. For example, the gate electrode 240 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but is not limited thereto.

The gate insulating layer 250 surrounds a sidewall of the channel layer 230 and may be interposed between the channel layer 230 and the gate electrode 240. For example, as illustrated in FIG. 14, the entire sidewall of the channel layer 230 may be surrounded by the gate insulating layer 250, and a portion of a sidewall of the gate electrode 240 may contact the gate insulating layer 250. In other embodiments, the gate insulating layer 250 extends in the extension direction of the gate electrode 240 (e.g., the first direction (X-direction), and of the sidewalls of the channel layer 230, only two sidewalls facing the gate electrode 240 may contact the gate insulating layer 250.

In example embodiments, the gate insulating layer 250 may be formed of a silicon oxide film, a silicon oxynitride film, a high-k film having a dielectric constant higher than that of the silicon oxide film, or combinations thereof. The high-k film may be formed of a metal oxide or a metal oxynitride. For example, a high-k film usable as the gate insulating layer 250 may be formed of HfO$_2$, HfSiO, HfSiON, HMO, HfSiO, HfZrO, ZrO$_2$, Al$_2$O$_3$, or combinations thereof, but is not limited thereto.

A plurality of second insulating patterns 232 may extend in a second direction (Y-direction) on the plurality of first insulating patterns 222, and a channel layer 230 may be disposed between two adjacent second insulating patterns 232 among the plurality of second insulating patterns 232. Also, a first buried layer 234 and a second buried layer 236 may be disposed between two adjacent second insulating patterns 232 and in a space between two adjacent channel layers 230. The first buried layer 234 is disposed at the bottom of the space between two adjacent channel layers 230, and the second buried layer 236 may be formed to fill the remainder of the space between two adjacent channel layers 230 on the first buried layer 234. The upper surface of the second buried layer 236 is disposed at the same level as the upper surface of the channel layer 230, and the second buried layer 236 may cover the upper surface of the gate electrode 240. Alternatively, the plurality of second insulating patterns 232 and the plurality of first insulating patterns 222 are formed of a continuous material layer, or the second buried layer 236 may be formed of a continuous material layer with the first buried layer 234.

A storage contact 260 may be disposed on the channel layer 230. The storage contact 260 is disposed to vertically overlap the channel layer 230, and may be arranged in a matrix form spaced apart from each other in the first direction (X-direction) and the second direction (Y-direction). The storage contact 260 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but inventive concepts are not limited thereto. The upper insulating layer 262 may surround sidewalls of the storage contact 260 on the plurality of second insulating patterns 232 and the second buried layer 236.

An etch stop layer 270 is disposed on the upper insulating layer 262, and a data storage structure 280 may be disposed on the etch stop layer 270. The data storage structure 280 may include a lower electrode 282, a dielectric layer 284, and an upper electrode 286.

The lower electrode 282 may pass through the etch stop layer 270 to be electrically connected to the upper surface of the storage contact 260. The lower electrode 282 may be formed in a pillar type extending in the third direction (Z-direction), but is not limited thereto. In example embodiments, the lower electrode 282 is disposed to vertically overlap the storage contact 260, and may be arranged in a matrix form spaced apart from each other in the first direction (X-direction) and the second direction (Y-direction). Alternatively, a landing pad (not illustrated) may be further disposed between the storage contact 260 and the lower electrode 282 so that the lower electrode 282 may be arranged in a hexagonal shape.

A phase change in the dielectric layer 284 may be induced during a heat treatment process by a separate phase control layer. After the dielectric layer 284 is phase changed, the separate phase control layer is removed, an upper electrode 286 may be formed on the phase-changed dielectric layer 284.

Figure 16:
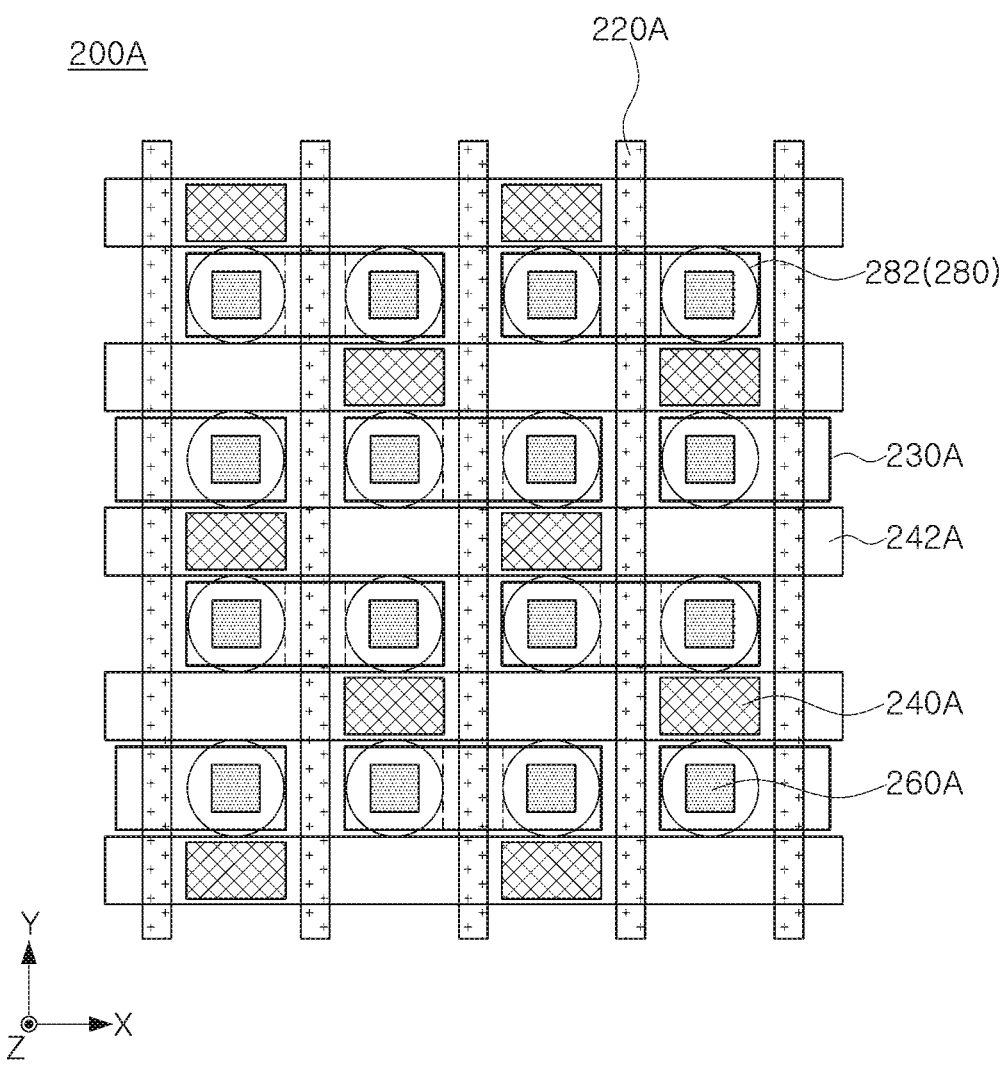
FIG. 16 is a layout diagram illustrating an integrated circuit device according to example embodiments.

FIG. 16 is a layout diagram illustrating an integrated circuit device according to example embodiments.

Figure 17:
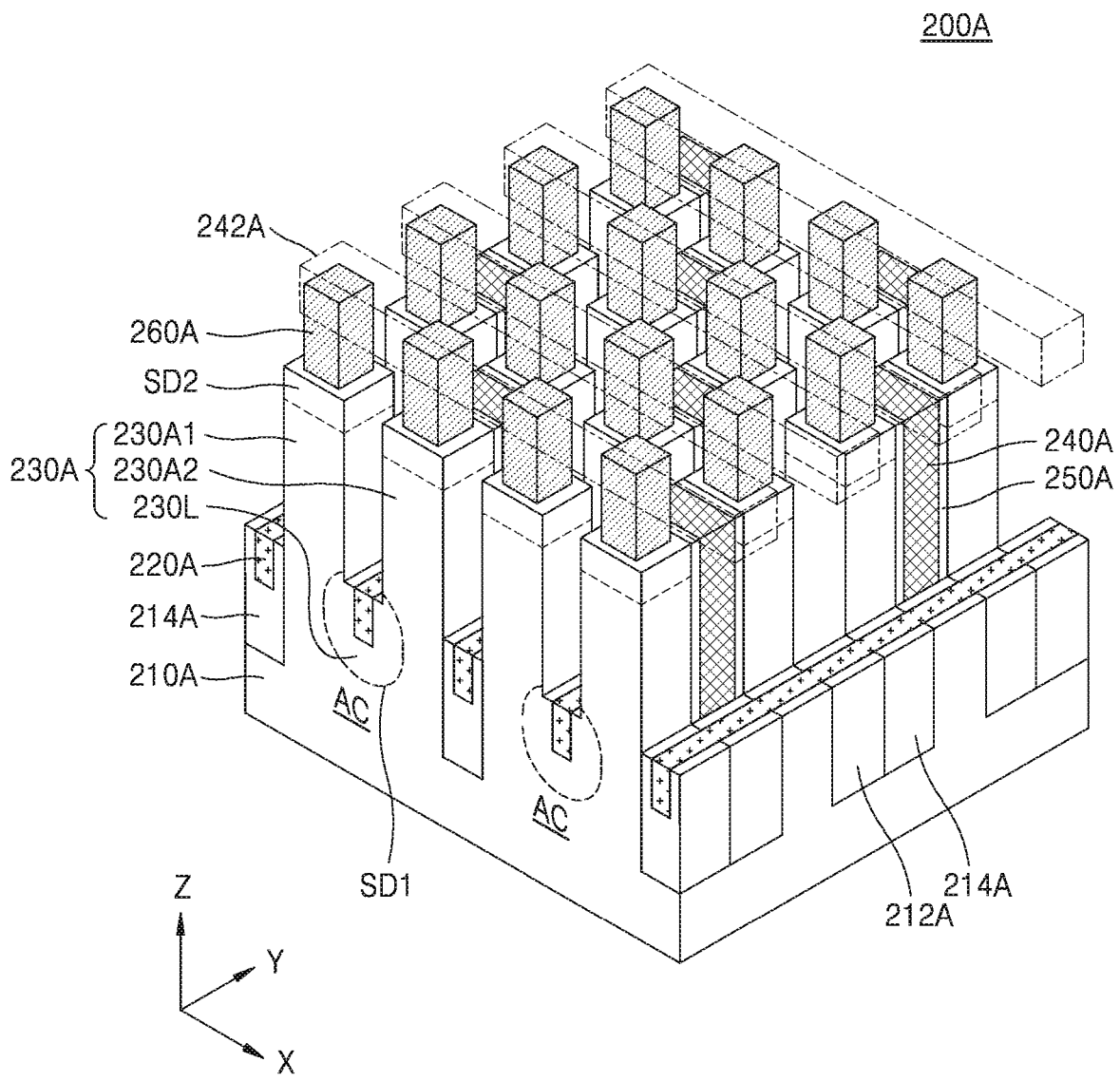
FIG. 17 is a perspective view illustrating an integrated circuit device according to example embodiments.

FIG. 17 is a perspective view illustrating an integrated circuit device according to example embodiments.

Referring to FIGS. 16 and 17, the integrated circuit device 200A may include a substrate 210A, a plurality of first conductive lines 220A, a channel structure 230A, a contact gate electrode 240A, a plurality of second conductive lines 242A, and a data storage structure 280. The integrated circuit device 200A may be a memory device including a vertical channel transistor (VCT).

A plurality of active regions AC may be defined in the substrate 210A by the first device isolation layer 212A and the second device isolation layer 214A. The channel structure 230A may be disposed in each active region AC, and the channel structures 230A may each include a first active pillar 230A1 and a second active pillar 230A2 extending in a vertical direction, and a connection part 230L connected to the bottom of the first active pillar 230A1 and the bottom of the second active pillar 230A2. A first source/drain area SD1 may be disposed in the connection part 230L, and a second source/drain area SD2 may be disposed above the first and second active pillars 230A1 and 230A2. The first active pillar 230A1 and the second active pillar 230A2 may each constitute an independent unit memory cell.

The plurality of first conductive lines 220A may extend in a direction crossing each of the plurality of active regions AC, for example, in a second direction (Y-direction). One first conductive line 220A of the plurality of first conductive lines 220A may be disposed on the connection portion 230L between the first active pillar 230A1 and the second active pillar 230A2, and the one first conductive line 220A may be disposed on the first source/drain region SD1. The other first conductive line 220A adjacent to the one first conductive line 220A may be disposed between the two channel structures 230A. One first conductive line 220A among the plurality of first conductive lines 220A may function as a common bit line included in two unit memory cells configured by the first active pillar 230A1 and the second active pillar 230A2 disposed on both sides of the one first conductive line 220A.

One contact gate electrode 240A may be disposed between two channel structures 230A adjacent in the second direction (Y-direction). For example, the contact gate electrode 240A may be disposed between the first active pillar 230A1 included in one channel structure 230A and the second active pillar 230A2 of the channel structure 230A adjacent thereto, and one contact gate electrode 240 may be shared by the first active pillar 230A1 and the second active pillar 230A2 disposed on both sidewalls thereof. A gate insulating layer 250A may be disposed between the contact gate electrode 240A and the first active pillar 230A1 and between the contact gate electrode 240A and the second active pillar 230A2. The plurality of second conductive lines 242A may extend in the first direction (X-direction) on the upper surface of the contact gate electrode 240A. The plurality of second conductive lines 242A may function as word lines of the integrated circuit device 200A.

A storage contact 260A may be disposed on the channel structure 230A. The storage contact 260A may be disposed on the second source/drain region SD2, and a data storage structure 280 may be disposed on the storage contact 260A.

A phase change in the dielectric layer of the data storage structure 280 may be induced during a heat treatment process by a separate phase control layer. After the dielectric layer is phase-changed, the separate phase control layer may be removed, and an upper electrode may be formed on the phase-changed dielectric layer.

Figure 18:
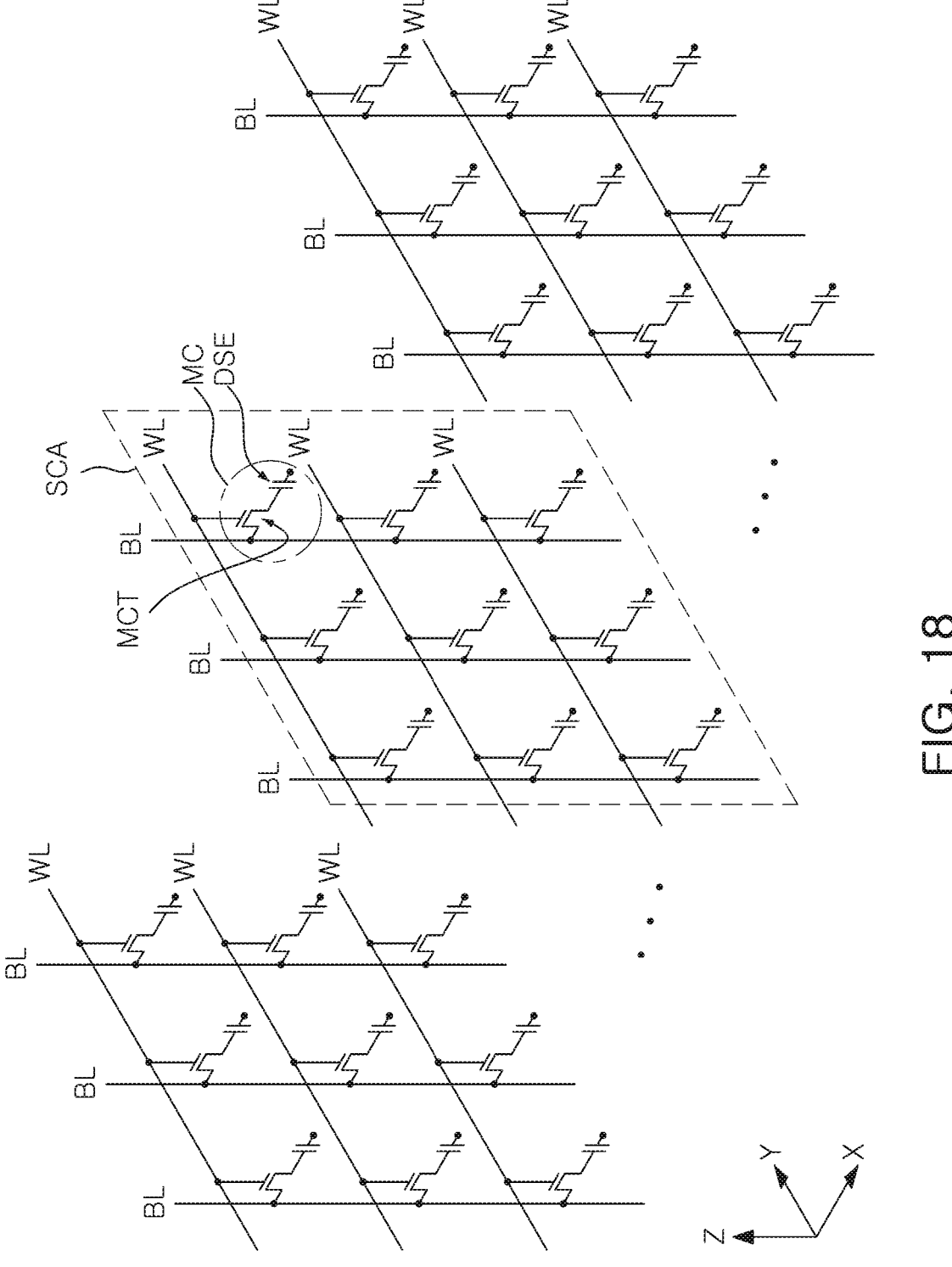
FIG. 18 is a simplified circuit diagram illustrating a cell array of a semiconductor device according to example embodiments.

FIG. 18 is a simplified circuit diagram illustrating a cell array of a semiconductor device according to example embodiments.

Referring to FIG. 18, a cell array of a semiconductor device according to example embodiments may include a plurality of sub-cell arrays SCA. The plurality of sub cell arrays SCA may be arranged along the X-direction. Each of the plurality of sub-cell arrays SCA may include a plurality of bit lines BL, a plurality of word lines WL, and a plurality of memory cells MC. The memory cell MC may include a memory cell transistor MCT and a data storage element DSE. One memory cell MC may be disposed between one word line WL and one bit line BL. The cell array of the semiconductor device may correspond to a memory cell array of a dynamic random access memory (DRAM) device.

The word lines WL may extend in the Y-direction. The word lines WL in one sub cell array SCA may be spaced apart from each other in the Z-direction. The bit lines BL may extend in the Z-direction. The bit lines BL in one sub cell array SCA may be spaced apart from each other in the Y-direction. The word lines WL and the bit lines BL may be conductive patterns (e.g., metal lines) disposed on a substrate (301 of FIG. 19) and extending in one direction.

The memory cell transistor MCT may include a gate, a source, and a drain. The gate may be connected to the word line WL, the source may be connected to the bit line BL, and the drain may be connected to the data storage element DSE. The data storage element (DSE) may include a capacitor consisting of lower and upper electrodes and a dielectric layer.

Figure 19:
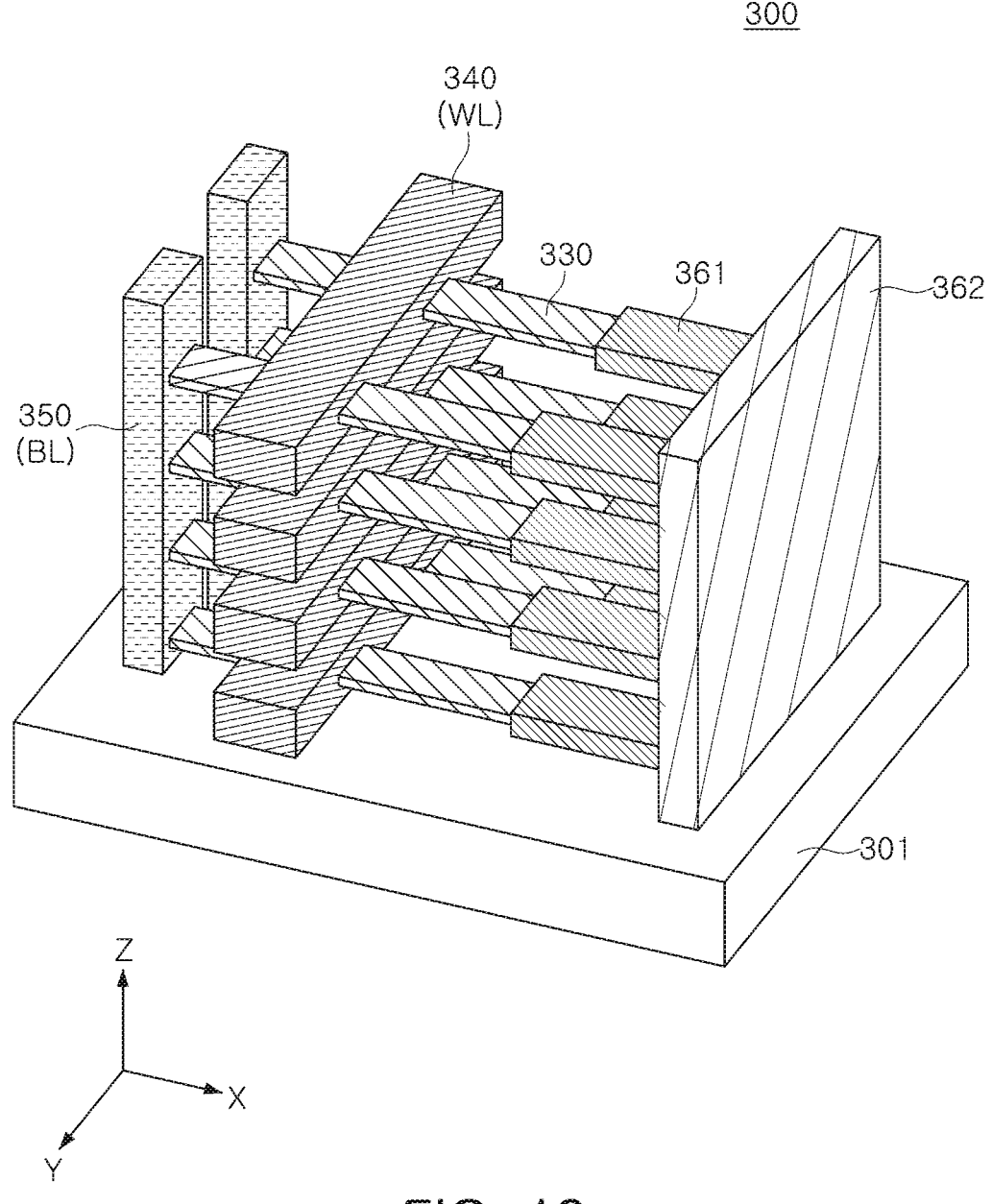
FIG. 19 is a perspective view illustrating a semiconductor device according to example embodiments.

FIG. 19 is a perspective view illustrating a semiconductor device according to example embodiments.

Figure 20:
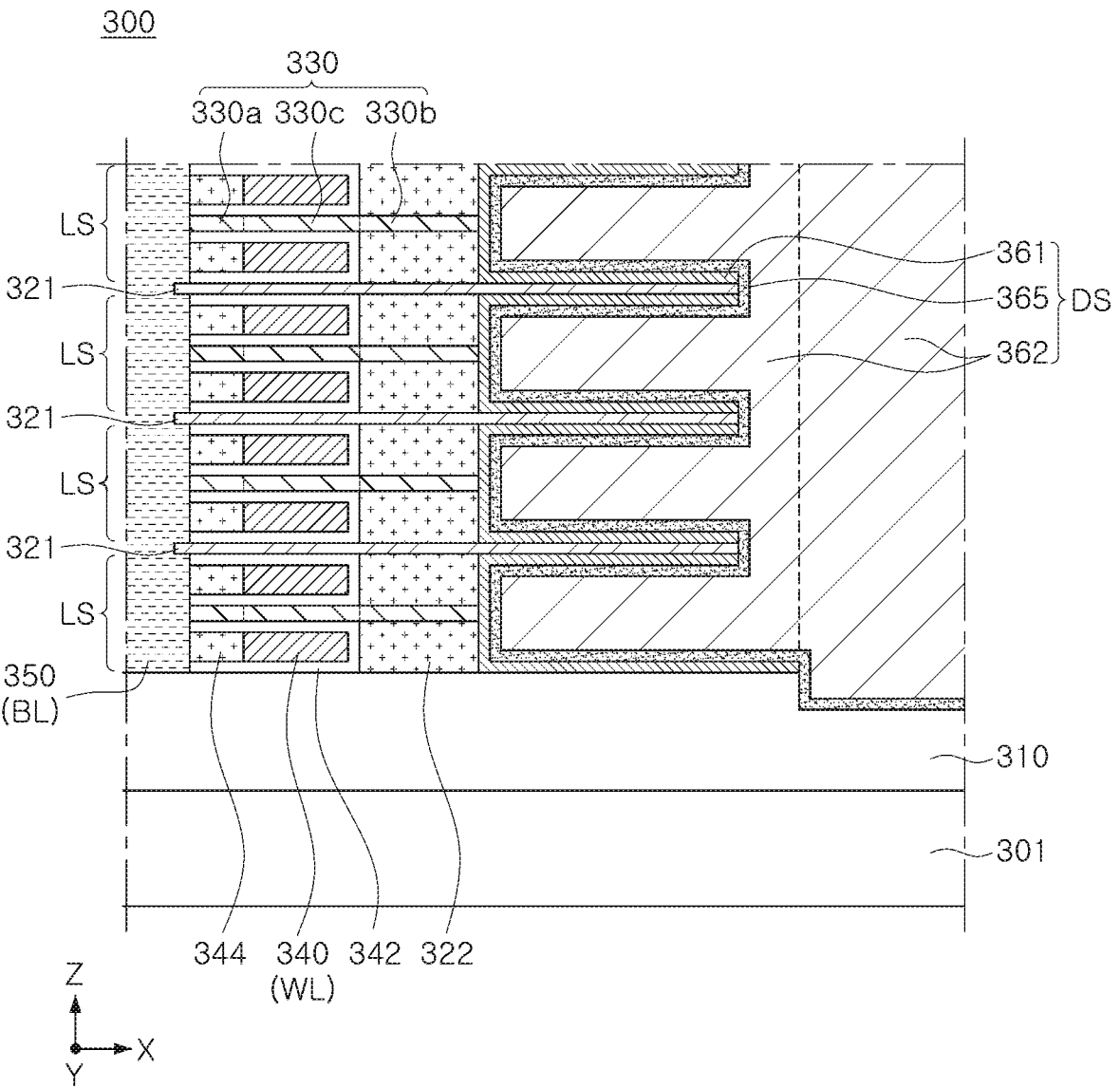
FIG. 20 is a cross-sectional view illustrating a semiconductor device according to example embodiments.

FIG. 20 is a cross-sectional view of a semiconductor device according to example embodiments. FIG. 20 illustrates a cross section corresponding to the semiconductor device in FIG. 19. In FIG. 20, the structure of a pair of adjacent sub-cell arrays described with reference to FIG. 19 is illustrated.

Referring to FIGS. 19 and 20, the semiconductor device 300 may include a substrate 301, a lower structure 310 on the substrate 301, a plurality of structures LS and a plurality of first insulating layers 321 alternately stacked on the substrate 301, and a plurality of second conductive patterns 350 spaced apart from each other. Each of the plurality of structures LS may include an active layer 330 extending in the X-direction, a first conductive pattern 340 intersecting the active layer 330 and extending in the Y-direction perpendicular to the X-direction, a gate dielectric layer 342 between the active layer 330 and the first conductive pattern 340, a gate capping layer 344 between the first conductive pattern 340 and the second conductive pattern 350, a first electrode 361 of the data storage structure DS, and a second insulating layer 322 between the first conductive pattern 340 and the first electrode 361. The data storage structure DS may further include a dielectric layer 365 on the first electrode 361 and a second electrode 362 on the dielectric layer 365. The X-direction and the Y-direction may be perpendicular to each other and parallel to the upper surface of the substrate 301. The Z-direction may be perpendicular to the X-direction and the Y-direction, and may be perpendicular to the upper surface of the substrate 301.

The lower structure 310 may be disposed on the substrate 301. The plurality of structures LS and the plurality of first insulating layers 321 may be stacked on the lower structure 310. The lower structure 310 may include a device region on the substrate 301 and an insulating region covering the device region. The insulating region may be formed of an insulating material such as silicon oxide, silicon nitride, silicon oxynitride, and silicon oxycarbide, and may be formed of insulating layers comprising at least one.

The plurality of structures LS and the plurality of first insulating layers 321 may form a stacked structure on the substrate 301. The plurality of structures LS may be disposed between the plurality of first insulating layers 321, and the plurality of first insulating layers 321 may be spaced apart from each other in the Z-direction. The first insulating layer 321 may extend along the X-direction, and an end portion thereof may extend into the second conductive pattern 350. The second insulating layer 322 may be disposed between the first insulating layer 321 and the active layer 330 and between the first conductive pattern 340 and the data storage structure DS. The first insulating layer 321 and the second insulating layer 322 may each include an insulating material, for example, at least one of silicon oxide, silicon nitride, silicon oxynitride, and silicon oxycarbide. The first insulating layer 321 may extend horizontally longer than the second insulating layer 322. The thickness of the second insulating layer 322 may be greater than the thickness of the first insulating layer 321.

The active layer 330 is disposed on the substrate 301 and may extend horizontally in the X-direction. A plurality of active layers 330 may be stacked spaced apart from each other in the Z-direction, and may be arranged in plurality in the Y-direction. A plurality of active layers 330 arranged in the Z-direction may be disposed between the plurality of first insulating layers 321. The active layer 330 may have a line shape, a bar shape, or a column shape that crosses the first conductive pattern 340 and extends in the X-direction. The active layer 330 may include a semiconductor material, for example, silicon, germanium, or silicon-germanium.

The active layer 330 may include a first impurity region 330a, a second impurity region 330b, and a channel region 330c. The first impurity region 330a may be electrically connected to the second conductive pattern 350. The second impurity region 330b may be electrically connected to the first electrode 361 of the data storage structure DS. The length of the second impurity region 330b in the X-direction may be longer than the length of the first impurity region 330a in the X-direction, but inventive concepts are not limited thereto. The channel region 330c may be disposed between the first impurity region 330a and the second impurity region 330b. The channel region 330c may overlap the first conductive pattern 340.

The first impurity region 330a and the second impurity region 330b may be formed by doping impurities or performing an ion implantation process into the active layer 330. The first impurity region 330a and the second impurity region 330b may have n-type or p-type conductivity.

A portion of the first impurity region 330a may correspond to a source region of the memory cell transistor MCT of FIG. 1, a portion of the second impurity region 330b may correspond to a drain region of the memory cell transistor MCT of FIG. 1, and the channel region 330c may correspond to a channel of the memory cell transistor MCT of FIG. 1. A portion of the first impurity region 330a may provide a first contact region for directly connecting the source region of the memory cell transistor MCT to the second conductive pattern 350, that is, the bit line BL, and a portion of the second impurity region 330b may provide a second contact region for directly connecting the drain region of the memory cell transistor MCT to the data storage element DSE, that is, the data storage structure DS.

In another example, the active layers 130 may include an oxide semiconductors, for example, at least one of hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), and indium-tin-zinc oxide (ITZO).

In another example, the active layers 130 may include a two-dimensional material (2D material) in which atoms form a desired crystal structure and form a channel of a transistor. The two-dimensional material layer may include at least one of a Transition Metal Dichalcogenide (TMD) material layer, a black phosphorous material layer and a hexagonal Boron-Nitride material layer (hBN material layer). For example, the two-dimensional material layer may include at least one of BiOSe, Crl, WSe$_2$, MoS$_2$, TaS, WS, SnSe, ReS, $\beta$-SnTe, MnO, AsS, P(black), InSe, h-BN, GaSe, GaN, SrTiO, MXene, and Janus 2D materials.

In another example, the structure LS may further include epitaxial layers grown from the active layer 130 and respectively connected to the first region 130a and the second region 130b of the active layer 130.

The first conductive pattern 340 is disposed on the substrate 301 and may extend horizontally in the Y-direction. A plurality of first conductive patterns 340 may be stacked spaced apart from each other in the Z-direction, and may be arranged in plurality in the X-direction. The first conductive pattern 340 may be disposed between the channel region 330c of the active layer 330 and the first insulating layer 321. The first conductive pattern 340 may be disposed on the upper surface 330US and the lower surface 330LS of the active layer 330. The first conductive pattern 340 may have a line shape, a bar shape, or a pillar shape that intersects the second conductive pattern 350 and extends in the Y-direction. not illustrated, but the plurality of first conductive patterns 340 stacked in the Z-direction in one memory cell may extend to have different lengths in the Y-direction to provide a contact region in which an upper surface of each is exposed.

The first conductive pattern 340 may include a conductive material, and the conductive material may include at least one of a doped semiconductor material, a conductive metal nitride, a metal, and a metal-semiconductor compound. The first conductive pattern 340 may be the word line WL described with reference to FIG. 17, and may also be referred to as a 'gate electrode'.

The gate dielectric layer 342 may be disposed between the first conductive pattern 340 and the active layer 330. The gate dielectric layer 342 may be formed between adjacent first insulating layers 321 to have a substantially conformal thickness to an inner space of a gap region formed by etching the second insulating layer 322 from the side. The gate dielectric layer 342 may include silicon oxide, silicon nitride, or a high-k material.

The gate capping layer 344 may be disposed to fill a region in which the first conductive pattern 340 is partially removed from the side surface. For example, the side of the gate capping layer 344 is in contact with the side of the first conductive pattern 340, and the top and bottom surfaces may be covered by a gate dielectric layer 342. The gate capping layer 344 may electrically insulate the first conductive pattern 340 and the second conductive pattern 350.

The second conductive pattern 350 may extend vertically on the substrate 301 in the Z-direction. A plurality of second conductive patterns 350 may be arranged in the Y-direction. The second conductive pattern 350 may be disposed adjacent to the first impurity region 330a and the first end surface of the active layer 330. The second conductive pattern 350 may have an inclined inner surface facing the inclined side surfaces of the first epitaxial layer 335a. A plurality of active layers 330 stacked in the Z-direction may be electrically connected to one second conductive pattern 350. The second conductive pattern 350 may have a line shape, a bar shape, or a pillar shape extending in the Z-direction. Although not illustrated, the semiconductor device may further include an upper wiring disposed on the second conductive pattern 350, is connected to the second conductive pattern 350, and extends in the X-direction. The second conductive pattern 350 may include at least one of a doped semiconductor material, a conductive metal nitride, a metal, and a metal-semiconductor compound. The second conductive pattern 350 may be the bit line BL described with reference to FIG. 17.

The data storage structure DS may be disposed adjacent to the second impurity region 330b and the second end surface of the active layer 330. The data storage structure DS may be electrically connected to the active layer 330. The data storage structure DS may include a first electrode 361, a dielectric layer 365 on the first electrode 361, and a second electrode 362 on the dielectric layer 365. The first electrode 361 of the data storage structure DS may have a cylinder shape as illustrated in FIG. 19, but inventive concepts are not limited thereto. For example, the first electrode 361 may have a pillar shape in embodiments.

The first electrode 361 may be formed to have a substantially conformal thickness in the inner space of the gap region formed by etching the second insulating layer 322 from the side. The first electrode 361 may have a state in which a node is separated for each structure LS by removing a portion on a side surface of the first insulating layer 321 after depositing a conductive material. The first electrode 361 may include at least one of a doped semiconductor material, a conductive metal nitride, a metal, and a conductive metal oxide.

The dielectric layer 365 may conformally cover the first electrode 361. The dielectric layer 365 covers the protruding portion 361p of the first electrode 361, and may include a protruding portion 365p toward the second electrode 362. The dielectric layer 365 may include a high dielectric material or silicon oxide, silicon nitride, silicon oxynitride, or combinations thereof. However, in some embodiments, the dielectric layer 365 may include oxide, nitride, silicide, oxynitride, or silicified oxynitride including at least one of Hf, Al, Zr, and La.

The second electrode 362 may cover the dielectric layer 365. The second electrode 362 may fill an inner space of the first electrode 361 having a cylindrical shape. The second electrode 362 may include at least one of a doped semiconductor material, a conductive metal nitride, a metal, and a metal-semiconductor compound.

In the dielectric layer 365 of the data storage structure DS, a phase change may be induced during a heat treatment process by a separate phase control layer. After the dielectric layer 365 is phase changed, the separate phase control layer is removed, an upper electrode may be formed on the phase-changed dielectric layer 365.

As set forth above, according to example embodiments, by forming a phase control layer on the dielectric layer, inducing a phase change in a material constituting the dielectric layer using the phase control layer, removing the phase control layer, and then forming an upper electrode on the phase-changed dielectric layer; a semiconductor device including a data storage structure with improved electrical characteristics and reliability, and a method of manufacturing the data storage structure may be provided.

While example embodiments have been illustrated and described above, it will be apparent to those skilled in the art that modifications and variations could be made without departing from the scope of the inventive concepts as defined by the appended claims.

What is claimed is:

1. A data storage structure comprising:
a lower electrode;
a dielectric layer on the lower electrode; and
an upper electrode on the dielectric layer, the upper electrode including an upper electrode interfacial layer in contact with the dielectric layer, wherein
the dielectric layer includes a metal compound having a crystalline phase and including a first metal,
the dielectric layer further includes a phase control material located in an interfacial region of the dielectric layer, the interfacial region being in contact with the upper electrode interfacial layer, the phase control material includes a second metal or a metal nitride, the metal nitride includes the second metal, and the upper electrode interfacial layer comprises a third metal and at least one of oxygen and nitrogen, wherein the third metal comprises at least one of tin, molybdenum, niobium, tantalum, titanium, indium, nickel, cobalt, tungsten, ruthenium, zirconium and hafnium.

2. The data storage structure of claim 1, wherein the metal compound of the dielectric layer comprises at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

3. The data storage structure of claim 1, wherein the second metal of the phase control material comprises at least one of molybdenum, cobalt, zirconium, niobium, titanium, copper, tantalum, vanadium, aluminum, scandium, chromium, manganese, nickel, rubidium, strontium, ruthenium, indium, tin, tungsten, iridium, and lanthanum.

4. The data storage structure of claim 1, wherein the metal compound of the dielectric layer comprises titanium oxide, and the second metal of the phase control material comprises molybdenum or cobalt.

5. The data storage structure of claim 1, wherein the metal nitride comprising the second metal of the phase control material comprises at least one of molybdenum nitride, cobalt nitride, vanadium nitride, and ruthenium nitride.

6. The data storage structure of claim 1, wherein the metal compound of the dielectric layer has a tetragonal crystal phase or an orthorhombic crystal phase.

7. The data storage structure of claim 1, wherein the metal compound of the dielectric layer has a rutile phase.

\* \* \* \* \*